(12) United States Patent
Saito

(10) Patent No.: US 8,107,303 B2
(45) Date of Patent: Jan. 31, 2012

(54) SEMICONDUCTOR RAM DEVICE WITH WRITING VOLTAGE HIGHER THAN WITHSTAND VOLTAGE OF SELECT TRANSISTOR

(75) Inventor: Toshihiko Saito, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 196 days.

(21) Appl. No.: 12/416,329

(22) Filed: Apr. 1, 2009

(65) Prior Publication Data

US 2009/0251941 A1 Oct. 8, 2009

(30) Foreign Application Priority Data

Apr. 3, 2008 (JP) ................... 2008-096833

(51) Int. Cl.
*G11C 7/00* (2006.01)
(52) U.S. Cl. .............. 365/189.16; 365/189.011
(58) Field of Classification Search .......... 365/189.011, 365/189.16
See application file for complete search history.

(56) References Cited

U.S. PATENT DOCUMENTS

| | | | | |
|---|---|---|---|---|
| 6,917,539 B2 * | 7/2005 | Rinerson et al. | ............. | 365/171 |
| 6,985,376 B2 | 1/2006 | Matsuoka | | |
| 7,343,147 B2 * | 3/2008 | Ruff et al. | ................ | 455/343.1 |
| 7,355,879 B2 | 4/2008 | Hirai et al. | | |
| 7,532,496 B1 * | 5/2009 | Bu | ................... | 365/94 |
| 7,663,195 B2 * | 2/2010 | Ohmi et al. | ................... | 257/409 |
| 7,701,747 B2 * | 4/2010 | Park et al. | .................... | 365/148 |
| 7,804,714 B1 * | 9/2010 | Bu et al. | .................... | 365/185.18 |
| 2006/0214008 A1 | 9/2006 | Asami et al. | | |
| 2006/0262589 A1 | 11/2006 | Hirai et al. | | |
| 2006/0267141 A1 | 11/2006 | Saito | | |
| 2006/0273182 A1 | 12/2006 | Iwata | | |
| 2007/0147104 A1 | 6/2007 | Kato et al. | | |
| 2007/0206403 A1 | 9/2007 | Shirahama et al. | | |
| 2007/0230235 A1 | 10/2007 | Abe et al. | | |
| 2008/0101108 A1 | 5/2008 | Tokunaga et al. | | |

FOREIGN PATENT DOCUMENTS

| | | |
|---|---|---|
| JP | 2007-12035 | 1/2007 |
| JP | 2007-234133 | 9/2007 |
| WO | WO 2005/060002 A1 | 6/2005 |
| WO | WO 2006/043573 A1 | 4/2006 |

OTHER PUBLICATIONS

European Search Report re application No. EP 09004259.9, dated Jul. 21, 2009.

* cited by examiner

*Primary Examiner* — VanThu Nguyen
(74) *Attorney, Agent, or Firm* — Husch Blackwell LLP

(57) ABSTRACT

A semiconductor device is provided, which includes a transistor, a memory element, a first control circuit and a second control circuit. A gate of the transistor is electrically connected to the first control circuit through a first word line, one of a source and a drain of the transistor is electrically connected to the second control circuit through a bit line, the other of the source and the drain of the transistor is electrically connected to a first terminal of the memory element, and a second terminal of the memory element is electrically connected to the first control circuit through a second word line.

20 Claims, 15 Drawing Sheets

SEMICONDUCTOR RAM DEVICE WITH WRITING VOLTAGE HIGHER THAN WITHSTAND VOLTAGE OF SELECT TRANSISTOR

BACKGROUND OF THE INVENTION

1. Field of the Invention

The present invention relates to a semiconductor memory device. Further, the present invention relates to a semiconductor device including the semiconductor memory device.

2. Description of the Related Art

In recent years, most electronic devices such as computers can perform desired operations by using a variety of data. When the data is held in, for example, a memory device (also referred to as a memory) or the like, the data can be used temporarily or semipermanently. A memory device also includes an external memory device (an auxiliary memory device) such as a hard disk or a flexible disk in a broad sense. However, a memory device almost always refers to a semiconductor memory device such as a CPU (central processing unit). Two main types of memory devices are a volatile memory and a nonvolatile memory. A volatile memory refers to a memory device in which data is lost over time after the data is held. A nonvolatile memory refers to a memory device in which data can be held semipermanently after the data is held.

Although a volatile memory has a possibility of losing data, it has an advantage of short access time. On the other hand, although a nonvolatile memory can hold data semipermanently, it has a disadvantage of high power consumption. Memory devices each have features in this manner, and each of the memory devices is used in accordance with the kind or usage of data.

Among the memory devices, there is a memory device functioning as a memory device (hereinafter referred to as a resistive random access memory device) by which the resistance of a memory element is changed, voltages before and after change in the resistance is determined, and the voltages are held as data. An example of a resistive random access memory device is described below. The resistive random access memory device includes a memory element having a structure in which a layer (hereinafter also referred to as a compound layer) which includes at least a layer of an organic compound or an inorganic compound such as silicon is interposed between a pair of electrodes. The memory element applies high voltage between a pair of electrodes, and the electrodes are short-circuited. Resistance of the memory element decreases according to this. In the above described resistive random access memory device, writing state or non-writing state is determined by existence of the short-circuit in the memory element, and voltage of each state is held to serve as a memory device (hereinafter referred to as a short-circuit type memory). (For example, Patent Document 1: Japanese Published Patent Application No. 2007-012035)

A conventional memory device shown in Patent Document 1 has a structure including a memory circuit provided with a select transistor connected to a word line and a bit line, and a memory element connected to one of the source and the drain. In a memory circuit electrically connected to a word line and a bit line, predetermined levels of potential are applied to a first terminal and a second terminal of the memory element through the word line and the bit line. The memory element is short-circuited when the potential difference between the first terminal and the second terminal is higher than or equal to a predetermined value (data writing state), and the memory element is not short-circuited when the potential difference is lower than a predetermined value (data non-writing state). Thus, data of 1 or 0 is stored in each memory element. Further, since a select transistor selects whether data is written in the memory element or not according to the potential from the outside, a select transistor with little variation is preferable. For example, a transistor of which a gate insulating film is thinned is preferred. This is because a gate insulating film is thinned, so that variation can be reduced, and capacitance per unit area can be increased.

SUMMARY OF THE INVENTION

However, in a conventional resistive random access memory device, when the structure with little variation as described above is applied to the select transistor, withstand voltage decreases. Thus, when the potential of the bit line is applied to the memory element through the select transistor, dielectric breakdown occurs in the select transistor, and there is a possibility that data cannot be written in the memory element. Particularly when the voltage (also referred to as the writing voltage) necessary for wiring data in a memory element is higher than the level of the withstand voltage of the select transistor, in writing operation, dielectric breakdown occurs in the select transistor when voltage necessary for wiring data in the memory element (also referred to as the writing voltage) is applied, so that there is a possibility that data cannot be written. Note that in this specification, the withstand voltage referred to critical voltage by which a gate terminal, and a source terminal or a drain terminal are short-circuited due to breakdown of a gate insulating film, or by which switching characteristics of a thin film transistor deteriorates, when high voltage is applied between the gate terminal, and the source terminal or the drain terminal of a thin film transistor.

In view of the foregoing problem, it is an object of the present invention to suppress dielectric breakdown of a transistor and to correctly write data in the memory element even when the level of writing voltage is higher than that of the withstand voltage.

One embodiment of the present invention is a semiconductor memory device including a potential control circuit, a potential supply terminal, a p-type transistor having a gate terminal, a source terminal, and a drain terminal, and a memory element including a first terminal and a second terminal. A first potential is applied to the gate terminal from the potential control circuit, and a second potential is applied to one of the source terminal and the drain terminal from the potential supply terminal. The first terminal is electrically connected to the other of the source terminal and the drain terminal of the p-type transistor, and the second potential is applied to the first terminal from the potential supply terminal through the p-type transistor. A third potential which is a negative potential is applied to the second terminal from the potential control circuit. The memory element comes to be a state in which data is written by changing resistance between the first terminal and the second terminal. A voltage necessary for writing data in the memory element (also referred to as a potential difference between the first terminal of the memory element and the second terminal of the memory element at the time of data writing) is higher than a withstand voltage of the p-type transistor. A potential difference between the first potential and the second potential at a time of data writing is larger than an absolute value of a threshold voltage of the p-type transistor and equal to or smaller than the withstand voltage of the p-type transistor. A potential difference between the second potential and the third potential at the time of data writing is larger than the withstand voltage of the p-type transistor and is equal to or larger than the voltage necessary for writing data in the memory element.

Another embodiment of the present invention is a semiconductor memory device including a memory circuit portion including a plurality of memory circuits, a word line control circuit (also referred to as a first control circuit) electrically connected to the memory circuit portion through a plurality of first word lines and a plurality of second word lines, and a bit line control circuit (also referred to as a second control circuit) electrically connected to the memory circuit portion through a plurality of bit lines. The memory circuit includes a p-type transistor including a gate terminal, a source terminal, and a drain terminal and a memory element including a first terminal and a second terminal. A first potential is applied to the gate terminal from the word line control circuit through any one of the plurality of first word lines, and a second potential is applied to one of the source terminal and the drain terminal from the bit line control circuit through any one of the plurality of bit lines. The first terminal is electrically connected to the other of the source terminal and the drain terminal of the p-type transistor, and the second potential is applied to the first terminal from the bit line control circuit through the p-type transistor and any one of the plurality of bit lines. A third potential which is a negative potential is applied to the second terminal from the word line control circuit through any one of the plurality of second word lines. The memory element comes to be a state in which data is written by changing resistance between the first terminal and the second terminal. A voltage necessary for writing data in the memory element is higher than a withstand voltage of the p-type transistor. A potential difference between the first potential and the second potential at a time of data writing is larger than an absolute value of a threshold voltage of the p-type transistor and equal to or smaller than the withstand voltage of the p-type transistor. A potential difference between the second potential and the third potential at the time of data writing is larger than the withstand voltage and equal to or larger than the voltage necessary for writing data in the memory element.

Note that a potential difference between the second potential and the third potential at the time of data writing can be higher than 10 V.

Further, the thickness of the gate insulating film of the p-type transistor can be 10 nm or less.

The memory element can have a structure which includes a first electrode to be a part of a second electrode, an organic compound layer provided over the first electrode, the second electrode to be a part of the first terminal and provided over the organic compound.

The memory element can have a structure which includes a first electrode to be a part of a second electrode, an inorganic compound layer provided over the first electrode, the second electrode to be a part of the first terminal and provided over the inorganic compound layer.

Another embodiment of the present invention is a semiconductor device which includes a memory circuit which is one of the above described embodiments, an antenna which transmits and receives data, an RF circuit which generates power supply voltage by using a signal which is received from the antenna, and a logic circuit to which the power supply voltage is input and which performs arithmetic calculation by using data stored in the semiconductor memory device.

According to another embodiment of the present invention, dielectric breakdown of a transistor can be suppressed and data can be written correctly in a memory element.

DETAILED DESCRIPTION OF THE INVENTION

Embodiment

Hereinafter, embodiments of the present invention will be described in detail with reference to the accompanying drawings. However, the present invention is not limited to the following description, and various changes and modifications for the modes and details thereof will be apparent to those skilled in the art unless such changes and modifications depart from the spirit and scope of the invention. Therefore, the present invention should not be interpreted as being limited to what is described in the embodiments described below.

Embodiment 1

In this embodiment, one embodiment of a semiconductor memory device of the present invention is described.

Figure 1:
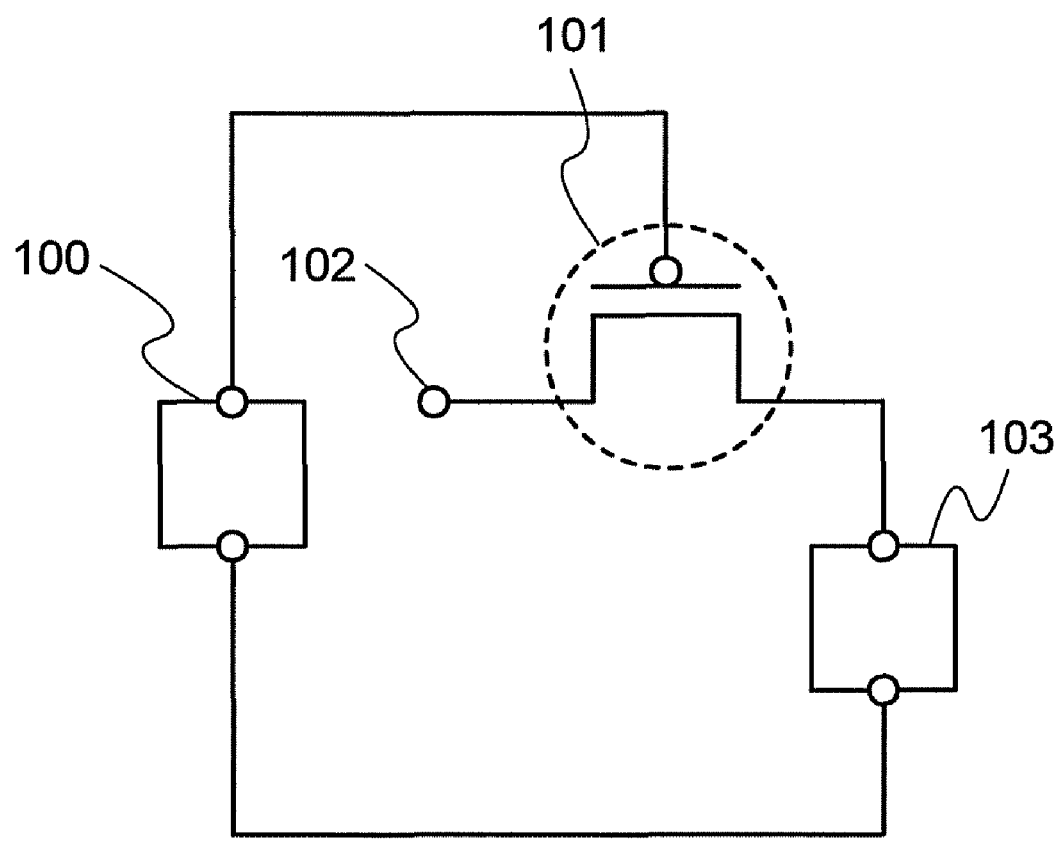
FIG. 1 illustrates a structure of a semiconductor memory device in Embodiment 1.

First, a structure of a semiconductor memory device in this embodiment is described with reference to FIG. 1. FIG. 1 is a circuit diagram which illustrates the structure of the semiconductor memory device in this embodiment.

As illustrated in FIG. 1, the semiconductor memory device in this embodiment includes a potential control circuit 100, a transistor 101, a potential supply terminal 102, and a memory element 103.

The potential control circuit 100 includes an input terminal, a first output terminal, and a second output terminal; however, the input terminal is not illustrated in FIG. 1, and only the first output terminal and the second output terminal are illustrated. In addition, the transistor 101 includes a gate terminal, a source terminal, and a drain terminal. The gate terminal is electrically connected to the first output terminal of the potential control circuit 100, and one of the source terminal and the drain terminal is electrically connected to the potential supply terminal 102. Further, the memory element 103 includes a first terminal and a second terminal. The first terminal is electrically connected to the other of the source terminal and the drain terminal of the transistor 101, and the second terminal is electrically connected to the second output terminal of the potential control circuit 100. Note that the transistor 101 has p-type conductivity in this embodiment. Further, although not illustrated, in the memory element 103, a capacitor means for supplement of charge at the time of data writing may be separately provided.

The potential control circuit 100 has a function for controlling the potential of the circuit which is connected thereto in accordance with a signal input from the outside. For example, the potential control circuit 100 can include a decoder circuit or the like.

A potential A which is a predetermined level or a potential B which is the ground potential is applied as a first potential (also referred to as V1) from the potential control circuit 100 to the gate terminal of the transistor 101, and a potential C which is a predetermined level or a potential D which is the ground potential is applied as a second potential (also referred to as V2) through the potential supply terminal 102 to the one of the source terminal and the drain terminal of the transistor 101. Note that the ground potential is a common reference potential used in the semiconductor device. For example, the ground potential can be a positive or negative constant potential, or 0 V. Further, the potential A is a positive potential which satisfies A>B, and the potential C is a positive potential which satisfies C>D.

As the transistor 101, a thin film transistor (TFT) including a non-single-crystal semiconductor film typified by amorphous silicon, polycrystalline silicon, microcrystalline (also referred to as nanocrystal, semi-amorphous) silicon, or the like can be used. The TFT includes a gate terminal, a source terminal, and a drain terminal. It is preferable that the TFT be formed over an insulating substrate (e.g., a glass substrate). In the case of using such TFTs, there are various advantages. For example, since a TFT can be formed at temperature lower than a transistor formed using single crystal silicon, reduction in manufacturing costs or increase in size of a manufacturing apparatus can be realized. Further, a substrate with low heat-resistance can be used. A TFT can be formed over a light transmitting substrate. Note that a transistor of which a gate insulating film is thinned can be used as a transistor in this embodiment. For example, the thickness of the gate insulating film can be 10 nm or less.

Alternatively, a transistor using a semiconductor substrate, an SOI substrate, or the like can be applied to the transistor 101. A transistor using a semiconductor substrate, an SOI substrate, or the like is a transistor with little variation in characteristics, size, shape, or the like, with high current supply capability, and with a small size. Therefore, low power consumption of circuits or high integration of circuits can be realized. In this embodiment, transistors of memory circuits are p-type transistors which have p-type conductivity.

The level of voltage applied between the first terminal and the second terminal of the memory element 103 is at a predetermined value or higher, so that resistance is changed. Therefore, a state in which resistance is changed or a state in which resistance is not changed is stored in the memory element 103 as data of 1 or 0. In addition, a potential E which is the ground potential or a potential F which is predetermined level is applied as a third potential (also referred to as V3) from the potential control circuit 100 to the second terminal of the memory element 103. Note that the potential F is a negative potential which is F<E.

As the memory element 103, any memory element can be used as long as it holds data in accordance with change in electric resistance of the element. That is, a memory element which includes a first electrode, a second electrode, and an organic compound layer provided between the first electrode and the second electrode (hereinafter also referred to as an organic memory element); a memory element which includes a first electrode, a second electrode, and a semiconductor layer of amorphous silicon or the like which is provided between the first electrode and the second electrode (hereinafter also referred to as an inorganic memory element); a PRAM (phase change random access memory); or the like can be used.

Next, operation of the semiconductor memory device in this embodiment is described. Note that, in this embodiment, a state in which resistance between the first terminal and the second terminal of a memory element in each memory circuit changes is referred to as a state in which data is written, and a state in which resistance between the first terminal and the second terminal does not change is referred to as a state in which data is not written. Further, in the state in which data is written, the data of 1 is stored in the memory element, and in the state in which data is not written, the data of 0 is stored in the memory element. Note that the above definition is an example, and embodiments of the present invention are not limited to this. For example, it is also possible that in the state in which data is written, the data of 0 is stored, and in the state in which data is not written, the data of 1 is stored.

First an operation when data is not written in a memory element is described.

When data is not written in a memory element, the first potential from the potential control circuit 100 is applied to the gate terminal of the transistor 101. In addition, the second potential is applied to one of the source terminal and the drain terminal through the potential supply terminal 102. As the levels of the first potential and the second potential when data is not written in the memory element 103, there are three cases: the case where the level of the first potential is the potential A, and the level of the second potential is the potential C; the case where the level of the first potential is the potential A, and the level of the second potential is the potential D; and the case where the level of the first potential is the potential B, and the level of the second potential is the potential D. In these cases, the transistor 101 becomes an off state. Note that it is preferable that the first potential and the second potential be set such that voltage applied between the gate terminal and the source terminal of the transistor 101, that is, the potential difference between the first potential and the second potential is set equal to or smaller than the withstand voltage of the transistor 101.

The potential of the first terminal of the memory element 103 is not changed because of an off state of the transistor 101, and the third potential is applied to the second terminal through the potential control circuit 100. The level of the third potential at this time is the potential E. Since resistance between the first terminal and second terminal of the memory element 103 is not changed at this time, data is not written. Therefore, data is not written in the memory element 103; in other words, data of 0 is stored.

Next, the case where data is written in a memory element is described.

At the time of data writing, the first potential from the potential control circuit 100 is applied to the gate terminal of the transistor 101. The second potential is applied to one of the source terminal and the drain terminal through the potential supply terminal 102. When data is written in the memory element 103, the level of the first potential is the potential B, and the level of the second potential is the potential C. Then, the transistor 101 becomes an on state. Note that it is preferable that the first potential and the second potential be set such that voltage applied between the gate terminal and the source terminal of the transistor 101, that is, the potential difference between the first potential and the second potential is set larger than the absolute value of the threshold voltage of the transistor 101 and equal to or smaller than the withstand voltage of the transistor 101.

The second potential from the potential supply terminal 102 is applied to the first terminal of the memory element 103 through the transistor 101, and the third potential from the potential control circuit 100 is applied to the second terminal. The level of the third potential at this time is the potential F. Voltage applied between the first terminal and the second terminal of the memory element 103, that is, the potential difference between the second potential and the third potential is $V2+|V3|$. Since the potential difference between the second potential and the third potential is larger than or equal to the writing voltage, resistance between the first terminal and the second terminal of the memory element 103 is changed. Therefore, data is written in the memory element 103; in other words, the data of 1 is stored. At this time, the writing voltage is preferably higher than the withstand voltage of the transistor 101.

The data of 1 or 0 can be stored in the memory element 103 through the above steps.

At the time of data writing, the potential difference between the first potential and the second potential is set equal to or smaller than the withstand voltage of the transistor, and the potential difference between the second potential and the third potential which are applied to the memory element is set larger than the withstand voltage of the transistor and equal to or larger than the writing voltage of the memory element. Thus, dielectric breakdown of the transistor can be suppressed and data can be surely written in the memory element even when a structure with little variation (for example, a gate insulating film is thinned) is applied to the transistor. Further, using the transistor of which a gate insulating film is thinned brings about reduction in variation, improvement in characteristics of a transistor, and reduction in the circuit area, whereby characteristics of the whole semiconductor memory device can also be improved.

Embodiment 2

In this embodiment, one embodiment of a specific structure of the semiconductor device described in Embodiment 1 is described.

Figure 2:
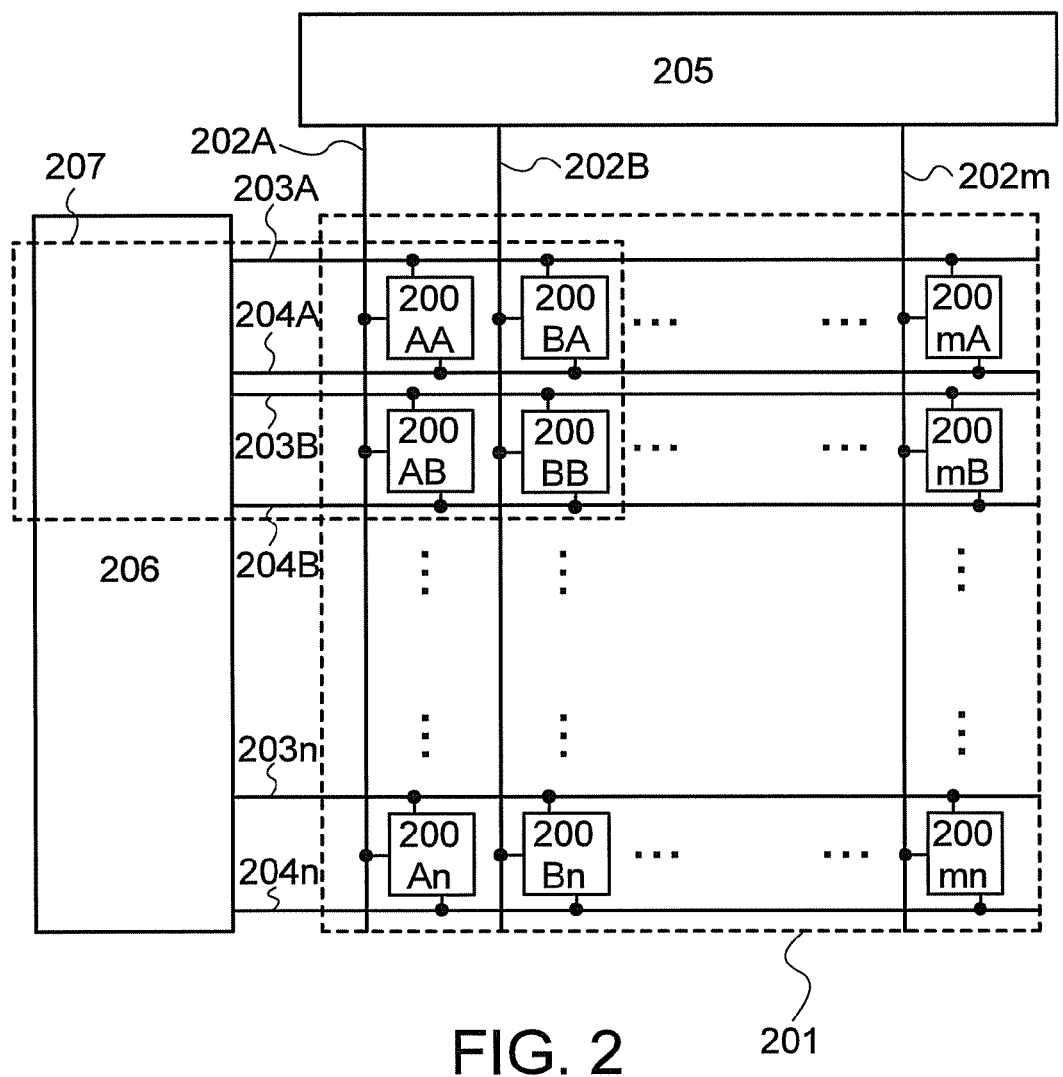
FIG. 2 illustrates a structure of a semiconductor memory device in Embodiment 2.

First, a structure of a semiconductor memory device in this embodiment is described with reference to FIG. 2. FIG. 2 is a block diagram illustrating the structure of the semiconductor memory device in this embodiment.

As illustrated in FIG. 2, the semiconductor memory device in this embodiment includes the following: a memory circuit portion 201 including a plurality of memory circuits 200 of m rows and n columns in which a first row includes a plurality of memory circuits 200 from a memory circuit 200AA to a memory circuit 200mA and a first column includes a plurality of memory circuits 200 from the memory circuit 200AA to a memory circuit 200An with reference to the memory circuit 200AA; a plurality of bit lines 202 including bit lines 202A to 202m; a plurality of first word lines 203 including first word lines 203A to 203n; a plurality of second word lines 204 including second word lines 204A to 204n; a bit line control circuit 205; and a word line control circuit 206.

Each memory circuit is electrically connected to the bit line control circuit 205 through any of the plurality of bit lines 202 and is electrically connected to the word line control circuit 206 through any of the plurality of first word lines 203 and any of the plurality of second word lines 204. For example, the plurality of memory circuits 200 (the memory circuit 200AA to the memory circuit 200An) in the first column are electrically connected to the bit line control circuit 205 through the bit line 202A, and the plurality of memory circuits 200 (the memory circuit 200AA to the memory circuit 200mA) in the first row are electrically connected to the word line control circuit 206 through any of the first word line 203A and any of the second word line 204A.

Figure 3:
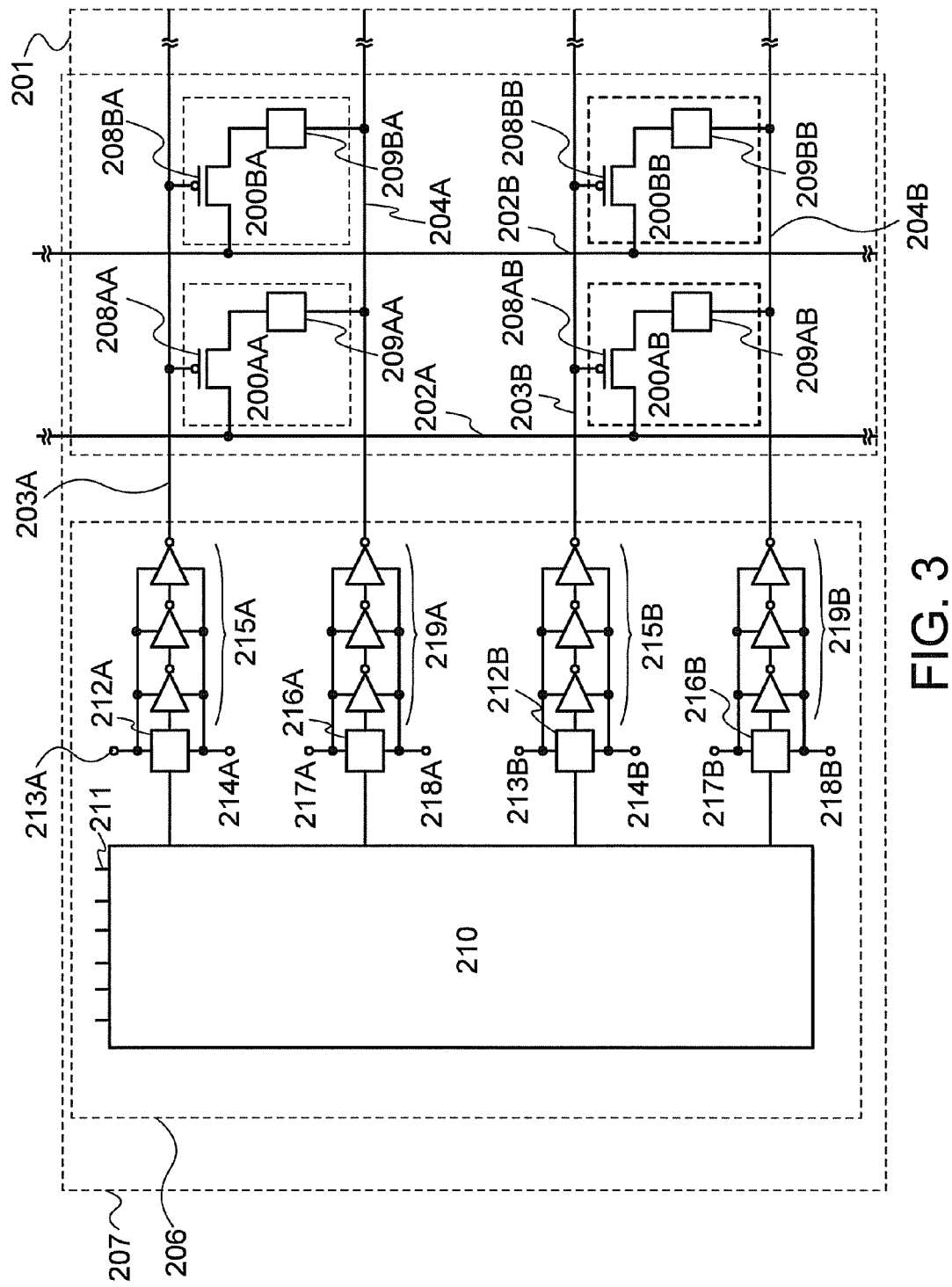
FIG. 3 illustrates a structure of a semiconductor memory device in Embodiment 2.

Further, a more specific structure of the semiconductor memory device of this embodiment in a region 207 is described with reference to FIG. 3. FIG. 3 is a block diagram illustrating the more specific structure of the semiconductor memory device of this embodiment.

As illustrated in FIG. 3, the semiconductor memory device in the region 207 includes the memory circuit portion 201 which has the memory circuit 200AA, a memory circuit 200BA, a memory circuit 200AB, and a memory circuit 200BB, the bit lines 202A and 202B, the first word lines 203A and 203B, the second word lines 204A and 204B, and the word line control circuit 206.

The memory circuit 200AA includes a transistor 208AA and a memory element 209AA. The transistor 208AA includes a gate terminal, a source terminal, and a drain terminal. The gate terminal is electrically connected to the word line control circuit 206 through the first word line 203A, and one of the source terminal and the drain terminal is electrically connected to the bit line 202A. The memory element 209AA includes a first terminal and a second terminal. The first terminal is electrically connected to the other of the source terminal and the drain terminal of the transistor 208AA, and the second terminal is electrically connected to the second word line 204A.

The memory circuit 200BA includes a transistor 208BA and a memory element 209BA. The transistor 208BA includes a gate terminal, a source terminal, and a drain terminal. The gate terminal is electrically connected to the word line control circuit 206 through the first word line 203A, and one of the source terminal and the drain terminal is electrically connected to the bit line control circuit 205 through the bit line 202B. The memory element 209BA includes a first terminal and a second terminal. The first terminal is electrically connected to the other of the source terminal and the drain terminal of the transistor 208BA, and the second terminal is electrically connected to the word line control circuit 206 through the second word line 204A.

The memory circuit 200AB includes a transistor 208AB and a memory element 209AB. The transistor 208AB includes a gate terminal, a source terminal, and a drain terminal. The gate terminal is electrically connected to the word line control circuit 206 through the first word line 203B, and one of the source terminal and the drain terminal is electrically connected to the bit line control circuit 205 through the bit line 202A. The memory element 209AB includes a first terminal and a second terminal. The first terminal is electrically connected to the other of the source terminal and the drain terminal of the transistor 208AB, and the second terminal is electrically connected to the word line control circuit 206 through the second word line 204B.

The memory circuit 200BB includes a transistor 208BB and a memory element 209BB. The transistor 208BB includes a gate terminal, a source terminal, and a drain terminal. The gate terminal is electrically connected to the word line control circuit 206 through the first word line 203B, and one of the source terminal and the drain terminal is electrically connected to the bit line control circuit 205 through the bit line 202B. The memory element 209BB includes a first terminal and a second terminal. The first terminal is electrically connected to the other of the source terminal and the drain terminal of the transistor 208BB, and the second terminal is electrically connected to the word line control circuit 206 through the second word line 204B.

Note that in the semiconductor device illustrated in FIG. 3, the word line control circuit 206 corresponds to the potential control circuit 100 in FIG. 1, and the transistor and the memory element provided in each memory circuit correspond to the transistor 101 and the memory element 103 in FIG. 1. Further, terminals of the word line control circuit 206 connected to the first word lines 203A and 203B corresponds to the first output terminal of the potential control circuit 100 in FIG. 1, and terminals of the word line control circuit 206 connected to the second word lines 204A and 204B corresponds to the second output terminal of the potential control circuit 100 in FIG. 1.

As the transistor 208AA, the transistor 208BA, the transistor 208AB, and the transistor 208BB, a thin film transistor (TFT) including a non-single-crystal semiconductor film typified by amorphous silicon, polycrystalline silicon, microcrystalline (also referred to as nanocrystal, semi-amorphous) silicon, or the like can be used. The TFT includes a gate terminal, a source terminal, and a drain terminal. It is preferable that the TFT be formed over an insulating substrate (e.g., a glass substrate). In the case of using such TFTs, there are various advantages. For example, since a TFT can be formed at temperature lower than a transistor formed using single crystal silicon, reduction in manufacturing costs or increase in size of a manufacturing apparatus can be realized. Further, a substrate with low heat-resistance can be used. A TFT can be formed over a light transmitting substrate. Note that a transistor of which a gate insulating film is thinned can be used as a transistor in this embodiment. For example, the thickness of the gate insulating film can be 10 nm or less.

Alternatively, a transistor using a semiconductor substrate, an SOI substrate, or the like can be applied to the transistor 208AA, the transistor 208BA, the transistor 208AB, and the transistor 208BB. A transistor using a semiconductor substrate, an SOI substrate, or the like is a transistor with little variation in characteristics, size, shape, or the like, with high current supply capability, and with a small size. Therefore, low power consumption of circuits or high integration of circuits can be realized. In this embodiment, transistors of memory circuits are p-type transistors which have p-type conductivity.

A potential G which is a predetermined level of potential or a potential H which is the ground voltage is applied to one of the source terminal and the drain terminal of each of the transistor 208AA and the transistor 208AB from the bit line control circuit 205 through the bit line 202A. Similarly, the potential G which is a predetermined level of potential or the potential H which is the ground voltage is applied to one of the source terminal and the drain terminal of each of the transistor 208BA and the transistor 208BB from the bit line control circuit 205 through the bit line 202B. Note that the ground potential is a common reference potential used in the semiconductor device. For example, the ground potential can be a positive or negative constant potential, or 0V. Further, the potential G is a positive potential which satisfies G>H.

Voltage applied between the first terminal and the second terminal, that is, the potential difference between the first terminal and the second terminal of each of the memory element 209AA, the memory element 209BA, the memory element 209AB, and the memory element 209BB is a predetermined value or higher, so that resistance is changed. Therefore, a state in which resistance is changed or a state in which resistance is not changed is stored as data of 1 or 0.

As the memory element 209AA, the memory element 209BA, the memory element 209AB, and the memory element 209BB, any memory element can be used as long as it holds data in accordance with change in electric resistance of the element. That is, a memory element which includes a first electrode, a second electrode, and an organic compound layer provided between the first electrode and the second electrode (hereinafter referred to as an organic memory); a memory element which includes a first electrode, a second electrode, and a semiconductor layer of amorphous silicon or the like which is provided between the first electrode and the second electrode (hereinafter referred to as an inorganic memory); a PRAM (phase change random access memory); or the like can be used.

The word line control circuit 206 includes a selection circuit 210, first level shifter circuits 212A and 212B, first potential supply terminals 213A and 213B, second potential supply terminals 214A and 214B, first buffer circuits 215A and 215B, second level shifter circuits 216A and 216B, third potential supply terminals 217A and 217B, fourth potential supply terminals 218A and 218B, and second buffer circuits 219A and 219B.

The selection circuit 210 is electrically connected to an address line 211 and has a function to select a memory circuit for writing data in accordance with an address signal (also referred to as a selection signal) input through the address line 211.

The first level shifter circuit 212A includes an input terminal and an output terminal, and the input terminal of the first level shifter circuit 212A is electrically connected to the selection circuit 210. In addition, the first level shifter circuit 212A is electrically connected to the first potential supply terminal 213A and the second potential supply terminal 214A.

The first buffer circuit 215A includes a plurality of the inverter circuits. Each inverter circuit has an input terminal and an output terminal. In addition, in the first buffer circuit 215A, the inverter circuits are electrically connected in series. In other words, if one inverter circuit is considered as one stage, an output terminal of the inverter circuit of the first stage is electrically connected to an input terminal of the inverter circuit of the second stage. In addition, an output terminal of the inverter circuit of the second stage is electrically connected to an input terminal of the inverter circuit of the third stage. Note that, in the first buffer circuit 215A, an input terminal of the inverter circuit of the first stage (an input terminal of the inverter circuit of the first stage in the first buffer circuit 215A of FIG. 3) is used as an input terminal of the first buffer circuit 215A, and an output terminal of an inverter circuit of the last stage (an output terminal of the inverter circuit of the third stage in the first buffer circuit 215A of FIG. 3) is used as an output terminal of the first buffer circuit 215A. In addition, each inverter circuit is electrically connected to the first potential supply terminal 213A and the second potential supply terminal 214A. Note that FIG. 3 illustrates a structure in which three inverter circuits are electrically connected in series as the first buffer circuit 215A; however, the number of inverter circuits is not limited to this and can be set as appropriate.

In addition, the input terminal of the first buffer circuit 215A is electrically connected to the output terminal of the first level shifter circuit 212A, and the output terminal of the first buffer circuit 215A is electrically connected the gate terminal of the transistor 208AA in the memory circuit 200AA and the gate terminal of the transistor 208BA in the memory circuit 200BA through the first word line 203A.

The second level shifter circuit 216A includes an input terminal and an output terminal, and the input terminal of the second level shifter circuit 216A is electrically connected to the selection circuit 210. In addition, the second level shifter circuit 216A is electrically connected to the third potential supply terminal 217A and the fourth potential supply terminal 218A.

The second buffer circuit 219A includes a plurality of inverter circuits. Each inverter circuit has an input terminal and an output terminal. In addition, in the second buffer circuit 219A, the inverter circuits are electrically connected in series. In other words, if one inverter circuit is considered as one stage, an output terminal of the inverter circuit of the first stage is electrically connected to an input terminal of the inverter circuit of the second stage. In addition, an output terminal of the inverter circuit of the second stage is electrically connected to an input terminal of the inverter circuit of the third stage. Note that, in the second buffer circuit 219A, an input terminal of the inverter circuit of the first stage (an input terminal of the inverter circuit of the first stage in the second buffer circuit 219A of FIG. 3) is used as an input terminal of the second buffer circuit 219A, and an output terminal of an inverter circuit of the last stage (an output terminal of the inverter circuit of the third stage in the second buffer circuit 219A of FIG. 3) is used as an output terminal of the second buffer circuit 219A. In addition, in each inverter circuit, a second input terminal is electrically connected to the third potential supply terminal 217A, and a third input terminal is electrically connected to the fourth potential supply terminal 218A. Note that FIG. 3 illustrates a structure in which three inverter circuits are electrically connected in series as the second buffer circuit 219A; however, the number of inverter circuits is not limited to this and can be set as appropriate.

In the second buffer circuit 219A, the input terminal is electrically connected to the output terminal of the second level shifter circuit 216A, and the output terminal is electrically connected to the second terminal of the memory element 209AA in the memory circuit 200AA and the second terminal of the memory element 209BA in the memory circuit 200BA through the second word line 204A.

The first level shifter circuit 212B includes an input terminal and an output terminal, and the input terminal of the first level shifter circuit 212B is electrically connected to the selection circuit 210. In addition, the first level shifter circuit 212B is electrically connected to the first potential supply terminal 213B and the second potential supply terminal 214B.

The first buffer circuit 215B includes a plurality of inverter circuits. Each inverter circuit has an input terminal and an output terminal. In addition, in the first buffer circuit 215B, the inverter circuits are electrically connected in series. In other words, if one inverter circuit is considered as one stage, an output terminal of the inverter circuit of the first stage is electrically connected to an input terminal of the inverter circuit of the second stage. In addition, an output terminal of the inverter circuit of the second stage is electrically connected to an input terminal of the inverter circuit of the third stage. Note that, in the first buffer circuit 215B, an input terminal of the inverter circuit of the first stage (an input terminal of the inverter circuit of the first stage in the first buffer circuit 215B of FIG. 3) is used as an input terminal of the first buffer circuit 215B, and an output terminal of an inverter circuit of the last stage (an output terminal of the inverter circuit of the third stage in the first buffer circuit 215B of FIG. 3) is used as an output terminal of the first buffer circuit 215B. In addition, each inverter circuit is electrically connected to the first potential supply terminal 213B and the second potential supply terminal 214B. Note that FIG. 3 illustrates a structure in which three inverter circuits are electrically connected in series as the first buffer circuit 215B; however, the number of inverter circuits is not limited to this and can be set as appropriate.

In the first buffer circuit 215B, the input terminal is electrically connected to the output terminal of the first level shifter circuit 212B, and the output terminal is electrically connected to the gate terminal of the transistor 208AB in the memory circuit 200AB and the gate terminal of the transistor 208BB in the memory circuit 200BB through the first word line 203B.

The second level shifter circuit 216B includes an input terminal and an output terminal, and the input terminal of the second level shifter circuit 216B is electrically connected to the selection circuit 210. In addition, the second level shifter circuit 216B is electrically connected to the third potential supply terminal 217B and the fourth potential supply terminal 218B.

The second buffer circuit 219B includes a plurality of inverter circuits. Each inverter circuit has an input terminal and an output terminal. In addition, in the second buffer circuit 219B, the inverter circuits are electrically connected in series. In other words, if one inverter circuit is considered as one stage, an output terminal of the inverter circuit of the first stage is electrically connected to an input terminal of the inverter circuit of the second stage. In addition, an output terminal of the inverter circuit of the second stage is electrically connected to an input terminal of the inverter circuit of the third stage. Note that, in the second buffer circuit 219B, an input terminal of the inverter circuit of the first stage (an input terminal of the inverter circuit of the first stage in the second buffer circuit 219B of FIG. 3) is used as an input terminal of the second buffer circuit 219B, and an output terminal of an inverter circuit of the last stage (an output terminal of the inverter circuit of the third stage in the second buffer circuit 219B of FIG. 3) is used as an output terminal of the second buffer circuit 219B. In addition, each inverter circuit is electrically connected to the third potential supply terminal 217B and the fourth potential supply terminal 218B. Note that FIG. 3 illustrates a structure in which three inverter circuits are electrically connected in series as the second buffer circuit 219B; however, the number of inverter circuits is not limited to this and can be set as appropriate.

In the second buffer circuit 219B, the input terminal is electrically connected to the output terminal of the second level shifter circuit 216B, and the output terminal is electrically connected to the second terminal of the memory element 209AB in the memory circuit 200AB and the second terminal of the memory element 209BB in the memory circuit 200BB through the second word line 204B.

Note that a potential I which is a predetermined level of potential is supplied from the first potential supply terminals 213A and 213B. Further, a potential J which is lower than the potential I is supplied in the case of a reading operation.

A potential K which is the ground potential is supplied from the second potential supply terminals 214A and 214B. Note that the potentials I and J are positive potentials which satisfy $I > J > K$.

A potential L which is the ground potential is supplied from the third potential supply terminals 217A and 217B.

A potential M which is a predetermined level of potential is supplied from the fourth potential supply terminals 218A and 218B. Further, a potential N which is the ground potential is supplied in the case of a reading operation. Note that the potential M is a negative potential which satisfy M<N.

Note that, in this embodiment, a buffer circuit is not necessarily provided. However, since the input potential from the selection circuit 210 can be amplified by providing the buffer circuit, the input potential from the selection circuit 210 can be lowered.

Next, an operation of the semiconductor memory device in this embodiment is described. Note that, in this embodiment, a state in which resistance between the first terminal and the second terminal of the memory element in each memory circuit changes is referred to as a state in which data is written, and a state in which resistance between the first terminal and the second terminal of the memory element does not change is referred to as a state in which data is not written. Further, in the state in which data is written, the data of 1 is stored in the memory element, and in the state in which data is not written, the data of 0 is stored in the memory element. Note that the above definition is just an example, and embodiment of the present invention is not limited to this. For example, it is also possible that in the state in which data is written, the data of 0 is stored, and in the state in which data is not written, the data of 1 is stored. Note that description is made under the condition in which the level of the potential G is equal to that of the potential I. "Equal" includes the case of substantially the same.

First, in the bit line control circuit 205, any bit line is selected from the bit lines 202A to 202m.

By the word line control circuit 206, any one of the first word line and the second word line are selected from the first word lines 203A to 203n and from the second word lines 204A to 204n, respectively. More specifically, in the selection circuit 210, any address line is selected from a plurality of address lines 211, and a predetermined level of potential is applied to the memory circuit which is electrically connected the selected address line through a word line. Here, as an example, the case where the bit line 202A, the first word line 203A, and the second word line 204A are selected is described.

The potential K which is the ground potential is applied to the selected first word line 203A from the selection circuit 210, the first level shifter circuit 212A, and the first buffer circuit 215A, and the potential I which is the predetermined level of potential is applied to the first word line 203B which is not selected, from the selection circuit 210, the first level shifter circuit 212B, and the first buffer circuit 215B. Further, the potential M which is the predetermined level of potential is applied to the selected second word line 204A from the selection circuit 210, the second level shifter circuit 216A, and the second buffer circuit 219A, and the potential L which is the ground potential is applied to the second word line 204B which is not selected, from the selection circuit 210, the second level shifter circuit 216B, and the second buffer circuit 219B. The potential G which is the predetermined level of potential is applied to the selected bit line 202A from the bit line control circuit 205.

At this time, in the memory circuit 200AA, the potential K which is the ground potential is applied to the gate terminal of the transistor 208AA as the first potential (also referred to as V1), and the potential G which is the predetermined level of potential is applied to one of the source terminal and the drain terminal as the second potential (also referred to as V2). Then, the transistor 208AA becomes an on state. Note that it is preferable that the first potential and the second potential be set such that voltage applied between the gate terminal and the source terminal of the transistor 208AA, that is, the potential difference between the first potential and the second potential is set larger than the absolute value of the threshold voltage of the transistor 208AA and equal to or smaller than the withstand voltage of the transistor 208AA.

The transistor 208AA becomes an on state, so that the second potential (the potential G) is applied to a first terminal of the memory element 209AA through the transistor 208AA, and the potential M which is the predetermined level of potential and which is the third potential (also referred to as V3) is applied to the second terminal. Voltage applied between the first terminal and the second terminal of the memory element 209AA, that is, the potential difference between the second potential and the third potential is V2+|V3|. Since V2+|V3| is higher than the writing voltage, resistance between the first terminal and the second terminal of the memory element 209AA is changed. The memory element 209AA of which resistance is changed becomes the state in which data is written, that is, the data of 1 is stored in the memory element 209AA.

In the memory circuit 200BA, the potential K is applied to the gate terminal of the transistor 208BA as the first potential, and the potential H which is the ground potential is applied to one of the source terminal and the drain terminal as the second potential. Then, the transistor 208BA becomes an off state. Note that it is preferable that the first potential and the second potential be set such that voltage applied between the gate terminal and the source terminal of the transistor 208BA, that is, the potential difference between the first potential and the second potential is set equal to or smaller than the withstand voltage of the transistor 208BA.

The transistor 208BA is an off state, so that the potential of the first terminal of the memory element 209BA is not changed, and the potential M is applied to the second terminal of the memory element 209BA as the third potential. Since resistance between the first terminal and the second terminal of the memory element 209BA is not changed, data is not written. Thus, the memory element 209BA becomes the state in which data is not written, that is, the data of 0 is stored in the memory element 209BA.

In the memory circuit 200AB, the potential I is applied to the gate terminal of the transistor 208AB as the first potential, and the potential G is applied to one of the source terminal and the drain terminal as the second potential. Then, the transistor 208AB becomes an off state. Note that it is preferable that the first potential and the second potential be set such that voltage applied between the gate terminal and the source terminal of the transistor 208AB, that is, the potential difference between the first potential and the second potential is set equal to or smaller than the withstand voltage of the transistor 208AB.

The transistor 208AB is an off state, so that the potential of the first terminal of the memory element 209AB is not changed, and the potential L which is the ground potential is applied to the second terminal of the memory element 209AB as the third potential. Since resistance between the first terminal and the second terminal of the memory element 209AB is not changed, data is not written. Thus, the memory element 209AB becomes the state in which data is not written, that is, the data of 0 is stored in the memory element 209AB.

In the memory circuit 200BB, the potential I is applied to the gate terminal of the transistor 208BB as the first potential, and the potential H which is the ground potential is applied to one of the source terminal and the drain terminal as the second potential. Then, the transistor 208BB becomes an off state.

Note that it is preferable that the first potential and the second potential be set such that voltage applied between the gate terminal and the source terminal of the transistor 208BB, that is, the potential difference between the first potential and the second potential is set equal to or smaller than the withstand voltage of the transistor 208BB.

The transistor 208BB is an off state, so that the potential of the first terminal of the memory element 209BB is not changed, and the potential L which is the ground potential is applied to the second terminal of the memory element 209BB as the third potential. Since resistance between the first terminal and the second terminal of the memory element 209BB is not changed, data is not written. Thus, the memory element 209BB becomes the state in which data is not written, that is, the data of 0 is stored in the memory element 209BB.

Note that, the example in which data is written in the memory circuit 200AA is described in this embodiment; however, the operation is not limited to this, and data can be written in another memory circuit.

The structure example in which the second terminal of the memory circuit is electrically connected to the word line control circuit through the second word line is described; however, the above described structure example is just one example, and the embodiment of the present invention is not limited to this. For example, an structure can be employed in which the structure of the word line control circuit is applied to the bit line control circuit, and the second bit line is provided, and the second terminal of the memory circuit is electrically connected to the bit line control circuit through the second bit line.

An optimum value of the first potential (V1) and the third potential (V3) in the semiconductor memory device of the embodiment is described below.

In this embodiment, it is preferable that the level of the first potential and the third potential be set appropriately in consideration of the withstand voltage of the transistor and voltage necessary for writing of the data in the memory element.

Figure 4A:
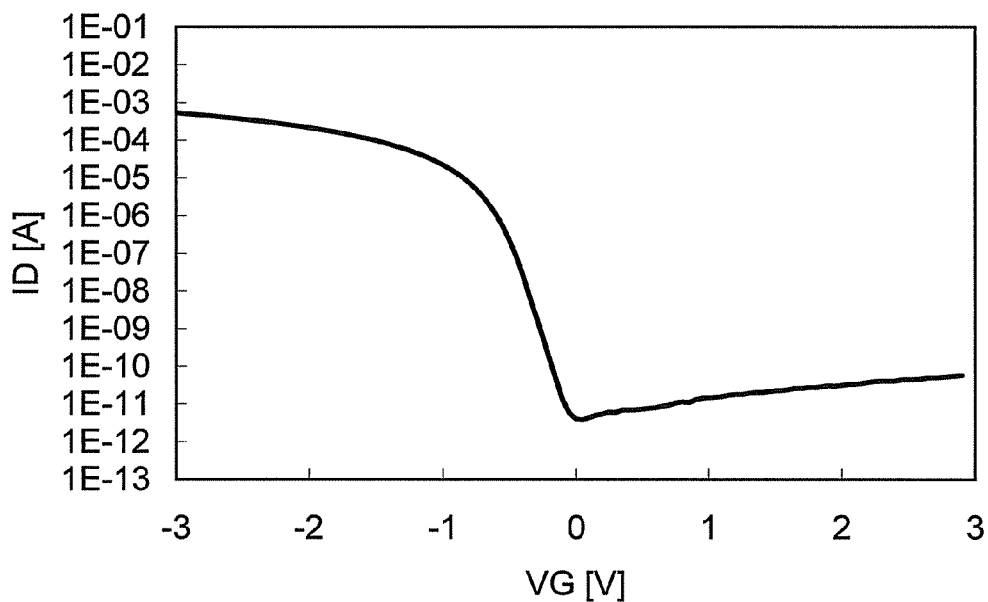
FIGS. 4A and 4B illustrate the relation between voltage and current of a transistor.
Figure 4B:
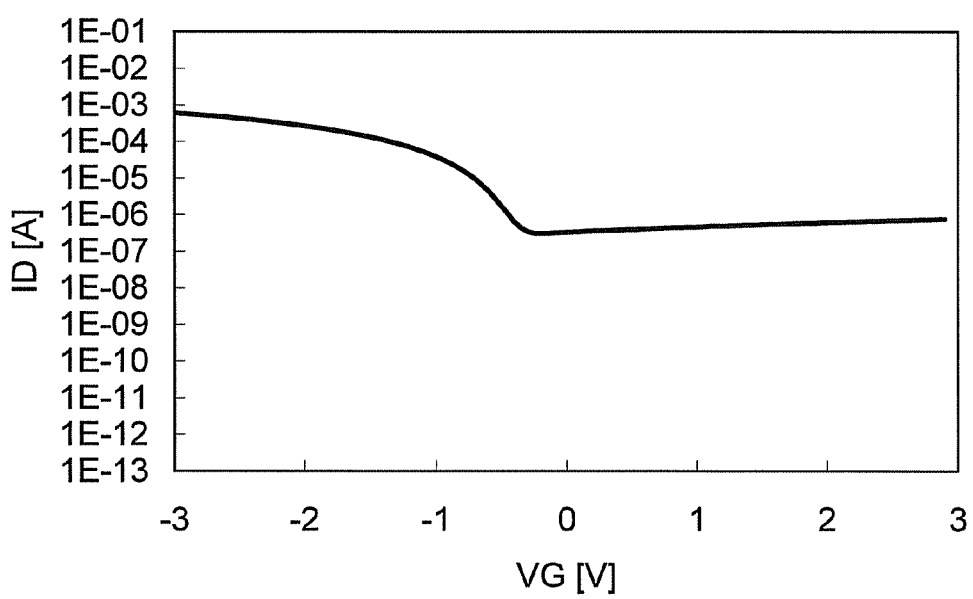

The withstand voltage of a transistor is described with use of diagrams illustrating relation of voltage between a gate terminal and a source terminal (also referred to as VG) to current flowing between a source terminal and a drain terminal (also referred to as ID) of the transistor which are illustrated in FIGS. 4A and 4B. FIG. 4A illustrates the case where stress voltage of 8 V is applied to the gate terminal, and FIG. 4B illustrates the case where stress voltage of 10 V is applied to the gate terminal. Note that a gate insulating film of the transistor is thinned to a thickness of approximately 10 nm.

As illustrated in FIG. 4A, when stress voltage of 8 V is applied, a normal switching characteristic of a transistor can be observed. On the other hand, as illustrated in FIG. 4B, when stress voltage of 10 V is applied, the amount of off-state current becomes large, so that the switching characteristic decreases. Thus, it is found that application of approximately stress voltage of 10 V to the transistor brings about deterioration. In right of this, the voltage applied between the gate terminal and the source terminal of the transistor, that is the potential difference between the first potential and the second potential is preferably less than 10 V.

Figure 5:
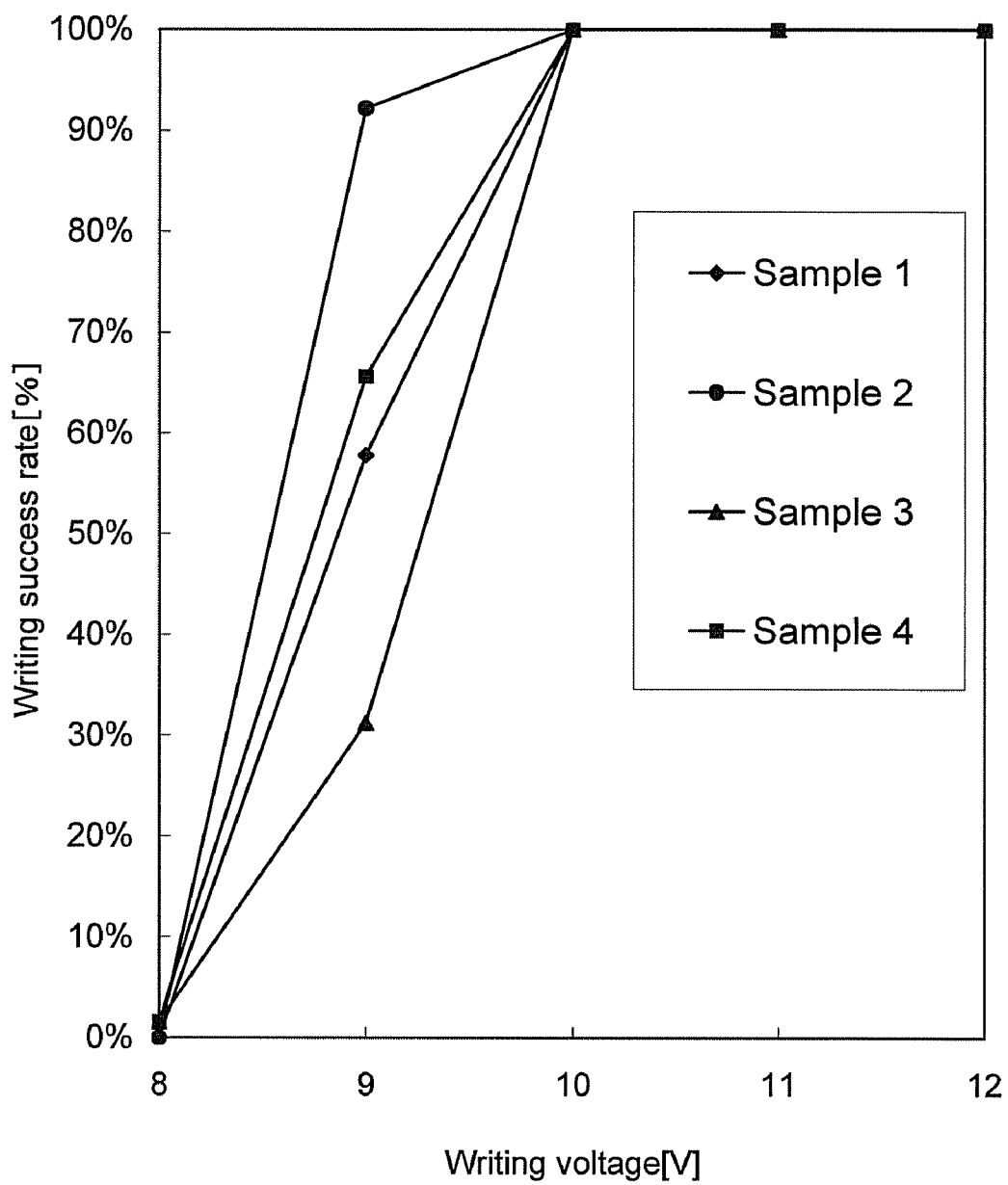
FIG. 5 illustrates the relation between writing voltage and writing success rate of a memory element.

In addition, the writing voltage is described with use of a graph illustrating the relation between the writing voltage and the success rate of writing which is illustrated in FIG. 5. As is clear from FIG. 5, resistance of the memory element decreases at approximately 10 V, so that it is found that the writing voltage is preferably set higher than 10 V, and the potential difference between the second potential and the third potential in the memory element is preferably equal to or larger than 10 V.

Therefore, for example, potentials are set as follows: the second potential is 7 V; the third potential is −3 V; that is, the absolute value of the second potential (hereinafter referred to as |V2|)>the absolute value of the third potential (hereinafter referred to as |V3|). Thus, suppression of the dielectric breakdown of the transistor, correct data writing in the memory element, and decrease of load to the memory element are possible.

Alternatively, for example, potentials are set as follows: the second potential is 5V; the third potential is −5 V; that is, |V2|=|V3|. Thus, suppression of the dielectric breakdown of the transistor and correct data writing in the memory element are possible.

Alternatively, for example, potentials are set as follows: the second potential is 1.5 V; the third potential is −8.5 V; that is, |V2|<|V3|. Thus, suppression of the dielectric breakdown of the transistor, correct data writing in the memory element, and reduction in circuit area by elimination of the need for separately providing a boosting circuit are possible.

Note that the above described levels of potentials are just examples and are not limited to the combinations. Another combination can be used as long as voltage applied between the gate terminal and the source terminal of the transistor is equal to or lower than the withstand voltage of the transistor and voltage applied between the first terminal and the second terminal of the memory element is higher than withstand voltage of the transistor and is equal to or higher than the writing voltage.

As described above, the data of 1 or 0 can be stored in the memory element.

At the time of data writing, the potential difference between the first potential and the second potential is set larger than the absolute value of the threshold voltage of the transistor and at equal to or smaller than the withstand voltage of the transistor, and the potential difference between the second potential and the third potential of the memory element is set larger than the withstand voltage of the transistor and at equal to or larger than the writing voltage of the memory element. Thus, dielectric breakdown of the transistor is suppressed and data can be written surely in the memory element even when a structure with little variation (for example, a gate insulating film is thinned) is applied to the transistor of the memory element. Further, using the transistor of which the gate insulating film is thinned brings reduction in variation, improvement in characteristics of the transistor, and reduction in the circuit area, whereby characteristics of the whole semiconductor memory device can also be improved.

Further, in the semiconductor memory device in this embodiment, data can be selectively written in a plurality of memory circuits, whereby larger amount of information can be stored as data.

Note that the above embodiment can be combined with any of the other embodiments, as appropriate.

Embodiment 3

In this embodiment, a semiconductor memory device (also referred to as an organic memory) in which a memory element using an organic compound is applied to a memory circuit as an example of a semiconductor memory device of the present invention is described.

Figure 6A:
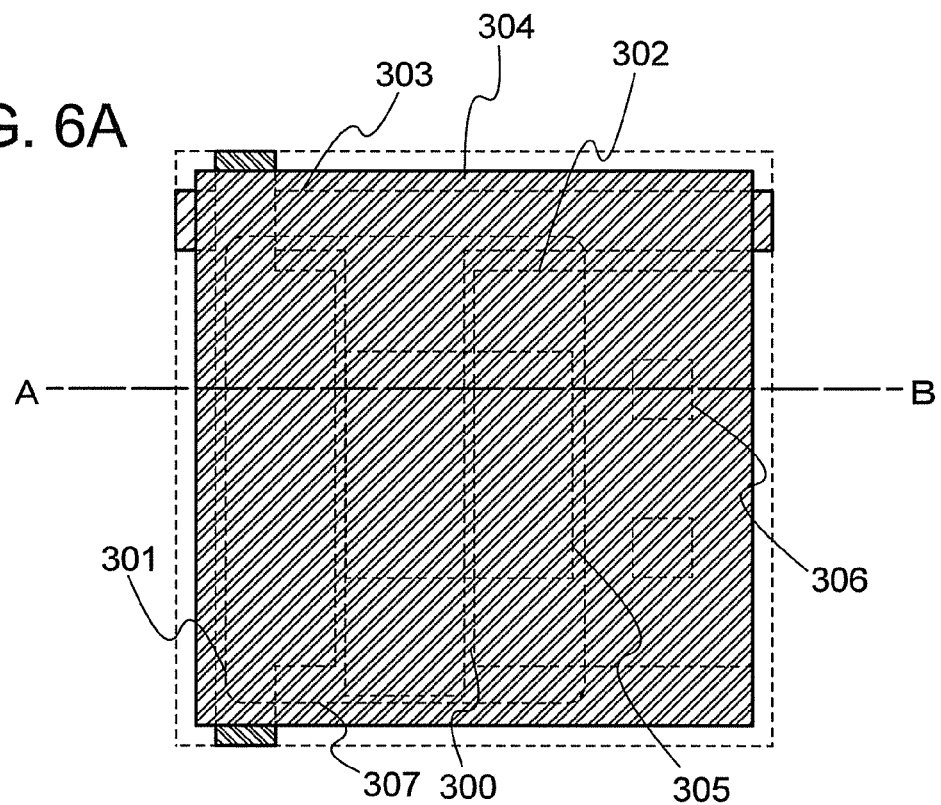
FIGS. 6A and 6B illustrate top views of a structure of a semiconductor memory device in Embodiment 3.
Figure 6B:
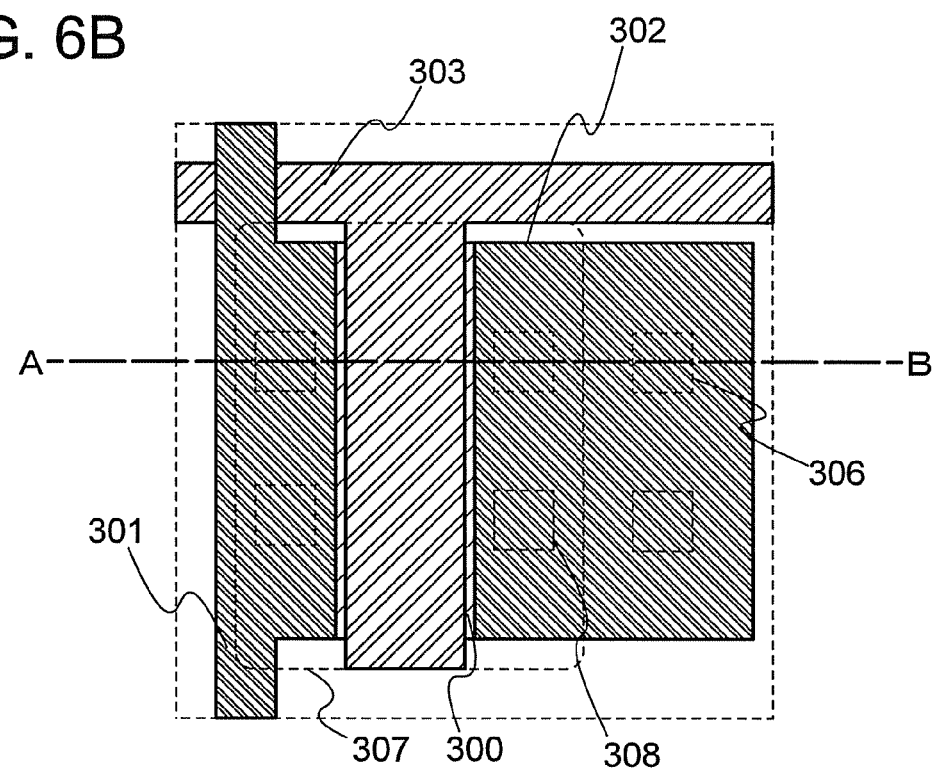
Figure 7:
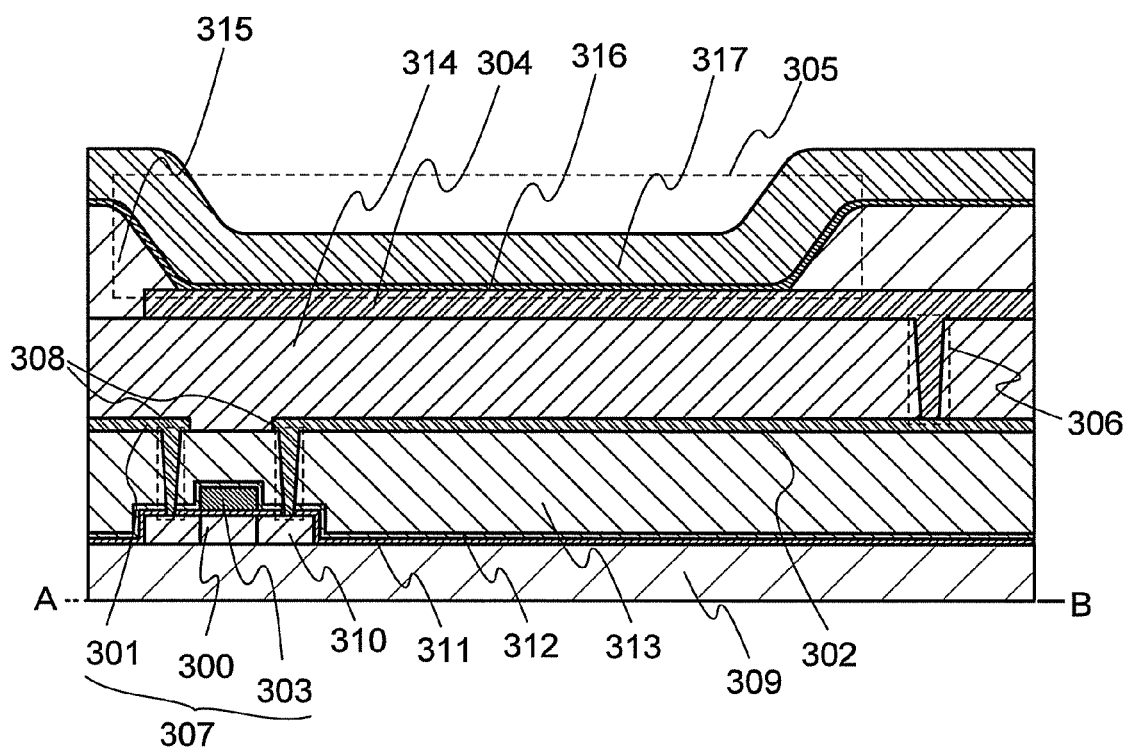
FIG. 7 illustrates a cross-sectional view of a structure of a semiconductor memory device in Embodiment 3.

A structure of an organic memory in this embodiment is described with reference to FIGS. 6A and 6B and FIG. 7. FIGS. 6A and 6B are top views illustrating a structure of a memory circuit of a semiconductor memory device in this embodiment. FIG. 7 is a cross-sectional view illustrating a structure of a memory circuit of a semiconductor memory device in this embodiment. Note that FIGS. 6A and 6B and FIG. 7 typically illustrate the semiconductor device for convenience, and all of or part of them is illustrated with use of the dimensions which are different from the actual dimension.

As illustrated in FIG. 6A, the memory circuit of the semiconductor memory device in this embodiment includes a semiconductor layer 300, an electrode 301, an electrode 302, an electrode 303, an electrode 304, an opening 305, and an opening 306. In addition, a transistor 307 is provided in the memory circuit of the semiconductor memory device in this embodiment. Further, FIG. 6B does not illustrate the electrode 304 which is a component illustrated in FIG. 6A for convenience, and as illustrated in FIG. 6B, the memory circuit of the semiconductor memory device in this embodiment includes an opening 308. Note that in the memory circuit of the semiconductor memory device in this embodiment, actually, an organic compound layer and an electrode to be an upper electrode are formed over the electrode 304; however, they are not illustrated in FIGS. 6A and 6B for convenience.

Next, FIG. 7 illustrates a cross-sectional structure taken along line AB of the memory circuit of the semiconductor memory device in this embodiment. The semiconductor memory device in this embodiment includes a substrate 309; a semiconductor layer 300 which is formed over the substrate 309 and includes an impurity region 310; a gate insulating film 311 provided so as to cover the semiconductor layer 300; an electrode 303 provided over the semiconductor layer 300 with a gate insulating film 311 interposed therebetween; a first interlayer film 312 provided over the electrode 303 and the gate insulating film 311; a second interlayer film 313 provided over the first interlayer film 312; an electrode 301 and an electrode 302 which are provided so as to be in contact with the impurity region 310 through an opening provided in the gate insulating film 311, the first interlayer film 312, and the second interlayer film 313; a third interlayer film 314 provided over the electrode 301, the electrode 302, and the second interlayer film 313; an electrode 304 provided so as to be in contact with the electrode 302 through the opening 306 provided in the third interlayer film 314; a fourth interlayer film 315 provided over the electrode 304 and the third interlayer film 314; an organic compound layer 316 provided so as to be in contact with the electrode 304 through the opening 305 provided in the fourth interlayer film 315; and an electrode 317 provided over the organic compound layer 316.

Further, the semiconductor memory device in FIG. 7 includes the transistor 307 having a semiconductor layer 300, a gate insulating film 311, an electrode 301, an electrode 302, and an electrode 303.

The impurity region 310 in the transistor 307 is formed by adding an impurity element which imparts p-type conductivity. For example, the impurity region 310 can be formed by adding a p-type impurity element such as boron.

A quartz substrate, a silicon substrate, a metal substrate, a stainless-steel substrate, or the like, in addition to a glass substrate and a flexible substrate, can be used as the substrate 309. A flexible substrate is a substrate which can be bent (flexible). For example, a plastic substrate or the like formed using polycarbonate, polyalylate, polyethersulfone, or the like can be given. Alternatively, an attachment film (formed using polypropylene, polyester, vinyl, polyvinyl fluoride, polyvinyl chloride, or the like), paper formed of a fibrous material, a base material film (polyester, polyamide, an inorganic vapor deposition film, paper, or the like), or the like can be used. Further, the memory cell array can be provided over a field effect transistor formed on a semiconductor substrate such as a silicon substrate, or over a thin film transistor formed over a substrate such as a glass substrate.

Alternatively, as the substrate 309, any of the following substrates can be used: a single crystal silicon substrate which has n-type or p-type conductivity, a compound semiconductor substrate (e.g., a GaAs substrate, an InP substrate, a GaN substrate, a SiC substrate, a sapphire substrate, a ZnSe substrate, or the like), and an SOI (silicon on insulator) substrate which is manufactured using a bonding method or a SIMOX (separation by implanted oxygen) method. Alternatively, a glass substrate to which single crystal silicon is attached can be used.

As the semiconductor layer 300, a single-layer structure or a stacked-layer structure of amorphous silicon, polycrystalline silicon, microcrystalline (also referred to as microcrystal or semi-amorphous) silicon, or the like can be used. The semiconductor layer 300 can be formed by a sputtering method, an LPCVD method, a plasma CVD method, or the like.

As the gate insulating film 311, one or a plurality of silicon oxide, silicon nitride, silicon oxynitride, and silicon nitride oxide can be applied. Note that the film thickness of the gate insulating film 311 in this embodiment can be 10 nm or less.

As the first interlayer film 312, the second interlayer film 313, the third interlayer film 314, and the fourth interlayer film 315, an organic material or an inorganic material can be used. For example, one or a plurality of silicon oxide, silicon nitride, silicon oxynitride, and silicon nitride oxide, or one or a plurality of polyimide, acrylic, a polyamide, polyimide amide, benzocyclobutene, siloxane, and polysilazane can be applied.

The electrode 303 functions as a gate electrode of the transistor 307 and a first word line in the above described Embodiment 2. As the electrode 303, tantalum, tungsten, titanium, molybdenum, aluminum, copper, chromium, niobium, or the like can be used. Alternatively, as well as a film formed of any of the above described metals, the electrode 303 can be formed using a film formed of an alloy which contains any of the above described metals as its main component or a film formed using a compound which includes any of the above described metals. In addition, they can be formed with a single layer or stacked layers. Further alternatively, the electrode 303 can be formed using a semiconductor such as polycrystalline silicon to which an impurity element which imparts conductivity to a semiconductor film such as phosphorus is added. The electrode 303 can be formed by being processed (e.g., patterned) into a predetermined shape after the above described material is formed entire surface of the substrate.

The electrode 301 and the electrode 302 function as a source electrode or a drain electrode in the transistor 307 and a bit line in Embodiment 2.

The electrode 304, the electrode 317, and the organic compound layer 316 function as a memory element in the above described Embodiment 1 and Embodiment 2. Specifically, the electrode 304 functions as part of a first terminal in the memory element, and the electrode 317 functions as part of a second terminal in the memory element.

An element or a compound with high conductivity can be used as the electrode 301, the electrode 302, the electrode 304, and the electrode 317. For example, one element selected from gold, silver, platinum, nickel, silicon, tungsten, chromium, molybdenum, iron, cobalt, copper, palladium, carbon, aluminum, manganese, titanium, tantalum, or the like, or an alloy which contains a plurality of the elements can be used. Further, they can be formed with a single layer or stacked layers. As an alloy containing a plurality of the above described elements, for example, an alloyed aluminum including aluminum and titanium, an alloy including titanium and carbon, an alloy including aluminum and nickel, an alloy including aluminum and carbon, an alloy including aluminum, nickel, and carbon, an alloy including aluminum and molybdenum, or the like can be applied. Alternatively, a light transmitting material such as indium tin oxide (ITO), indium tin oxide including silicon oxide (ITSO), or indium zinc oxide (IZO) can be used. Further, each of the electrode 301, the electrode 302, the electrode 304, and the electrode 317 can be formed using a different material. The electrode 301, the electrode 302, the electrode 304, and the electrode 317 can be formed by a vapor deposition method, a sputtering method, a CVD method, a printing method, or a droplet discharge method.

As the organic compound layer 316, an organic resin typified by polyimide, acrylic, polyamide, benzocyclobutene, epoxy, or the like can be combined with an organic compound which has hole transporting properties or an organic compound which has electron transporting properties.

As the organic compound having a hole-transporting property, for example, phthalocyanine (abbreviation: $H_2Pc$), copper phthalocyanine (abbreviation: CuPc), and vanadyl phthalocyanine (VOPc) are given. In addition, the following are given: 4,4',4"-tris(N,N-diphenylamino)triphenylamine (abbreviation: TDATA); 4,4',4"-tris[N-(3-methylphenyl)-N-phenylamino]triphenylamine (abbreviation: MTDATA); 1,3,5-tris[N,N-di(m-tolyl)amino]benzene (abbreviation: m-MTDAB); N,N'-diphenyl-N,N'-bis(3-methylphenyl)-1,1'-biphenyl-4,4'-diamine (abbreviation: TPD); 4,4'-bis[N-(1-naphthyl)-N-phenylamino]biphenyl (abbreviation: NPB); 4,4'-bis{N-[4-di(m-tolyl)amino]phenyl-N-phenylamino}biphenyl (abbreviation: DNTPD); 4,4'-bis[N-(4-biphenylyl)-N-phenylamino]biphenyl (abbreviation: BBPB); 4,4',4"-tri(N-carbazolyl)triphenylamine (abbreviation: TCTA); and the like. However, the material is not limited to these. The materials described here are mainly materials having hole mobility of $10^{-6}$ $cm^2/Vs$ or more.

As the organic compound having an electron-transporting property, the following material such as a metal complex having a quinoline skeleton or a benzoquinoline skeleton, or the like can be used: tris(8-quinolinolato)aluminum (abbreviation: to $Alq_3$), tris(4-methyl-8-quinolinolato)aluminum (abbreviation: $Alq_3$), bis(10-hydroxybenzo[h]-quinolinato) beryllium (abbreviation: $BeBq_2$), or bis(2-methyl-8-quinolinolato)-4-phenylphenolato-aluminum (abbreviation: BAlq). Alternatively, a material of a metal complex having an oxazole or thiazole ligand such as bis[2-(2-hydroxyphenyl) benzoxazolato]zinc (abbreviation: $Zn(BOX)_2$) or bis[2-(2-hydroxyphenyl)benzothiazolato]zinc (abbreviation: $Zn(BTZ)_2$), or the like can be used. In addition to the metal complex, 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4'-tert-butylphenyl)-4-phenyl-5-(4"-biphenyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproine (abbreviation: BCP); or the like can be used. The materials described here are mainly materials having electron mobility of $10^{-6}$ $cm^2/Vs$ or more.

Note that a substance having mobility outside the above range, for example, 2,3-bis(4-diphenylaminophenyl)quinoxaline (abbreviation: TPAQn), 9-[4-(N-carbazolyl)]phenyl-10-phenylanthracene (hereinafter referred to as CzPA), or the like may also be used.

The organic compound layer 316 may be formed using a mixture of a plurality of the above-mentioned organic compounds. Furthermore, the organic compound layer 316 may be formed by stacking the above-mentioned organic compounds.

As the organic compound layer 316, an insulator may also be mixed into the organic compound having a hole-transporting property or an electron-transporting property. Note that the insulator does not have to be dispersed equally. The insulator is mixed, whereby the morphology of the organic compound layer 316 can be improved. Thus, since partial crystallization or the like of the film can be suppressed, variations in behavior of each memory element can be further suppressed.

Further, it is preferable that the thickness of the organic compound layer 316 be thickness where electric resistance of the memory element is changed by applying voltage to the electrode 304 and the electrode 317. A typical thickness of the organic compound layer 316 is 1 nm to 100 nm, preferably, 10 nm to 60 nm, more preferably, 5 nm to 30 nm.

The writing principle of the memory element in this embodiment is described below.

When the temperature of the substance of the organic compound layer 316 rises to a transition point, the organic compound layer 316 has fluidity. Thus, when the temperature of the organic compound layer 316 which includes an organic compound material rises to a transition point or higher, the organic compound layer 316 has fluidity and does not have a certain form. When the organic compound layer 316 has fluidity, the form of the material of the organic compound layer 316 in a solid state is not maintained and is changed over time. Therefore, the organic compound layer 316 is transformed, and the region where the electrode 304 and the electrode 317 are short-circuited is partly formed. The electrode 304 and the electrode 317 are short-circuited, whereby a resistance in the memory element is decreased. Using the principle by which resistance changes, the respective states before and after the resistance changes are distinguished as a data in the memory element.

Alternatively, a structure where an insulating layer is provided between the electrode 304 and the electrode 317 can be used. When the insulating layer is provided, expansion of the organic compound layer which has fluidity can be controlled, so that the electrode 304 and the electrode 317 can be short-circuited more surely.

As described above, an organic memory is applied to the semiconductor memory device in this embodiment, whereby the semiconductor memory device can be manufactured at a low cost. Further, characteristics of the memory element can be easily changed by changing the included material. Furthermore, by employing a semiconductor memory device in this embodiment, a thin semiconductor memory device with high reliability can be provided.

Note that this embodiment can be combined with any of the other embodiments as appropriate.

Embodiment 4

In this embodiment, a semiconductor memory device (also referred to as an inorganic memory) in which a memory element using inorganic compound is applied to a memory circuit as an example of semiconductor memory device of the present invention is described.

Figure 8:
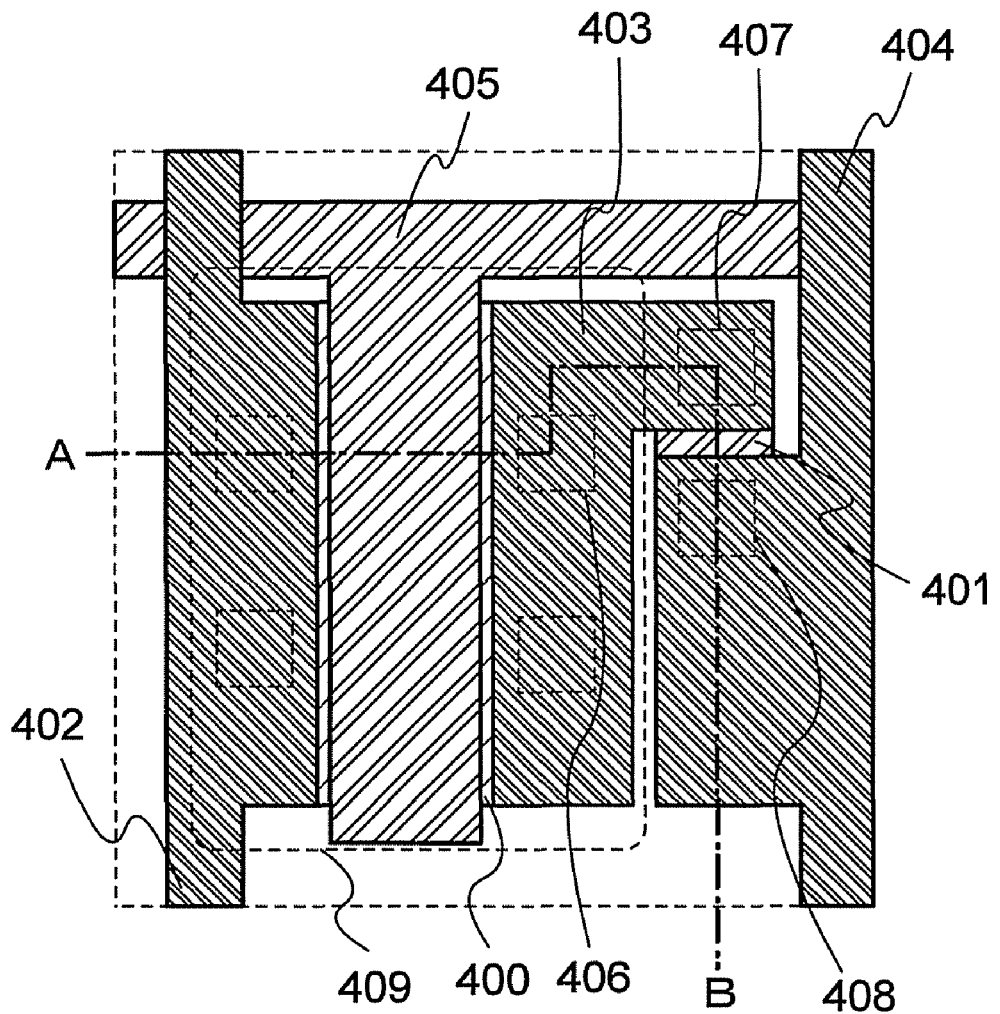
FIG. 8 illustrates a top view of a structure of a semiconductor memory device in Embodiment 4.
Figure 9:
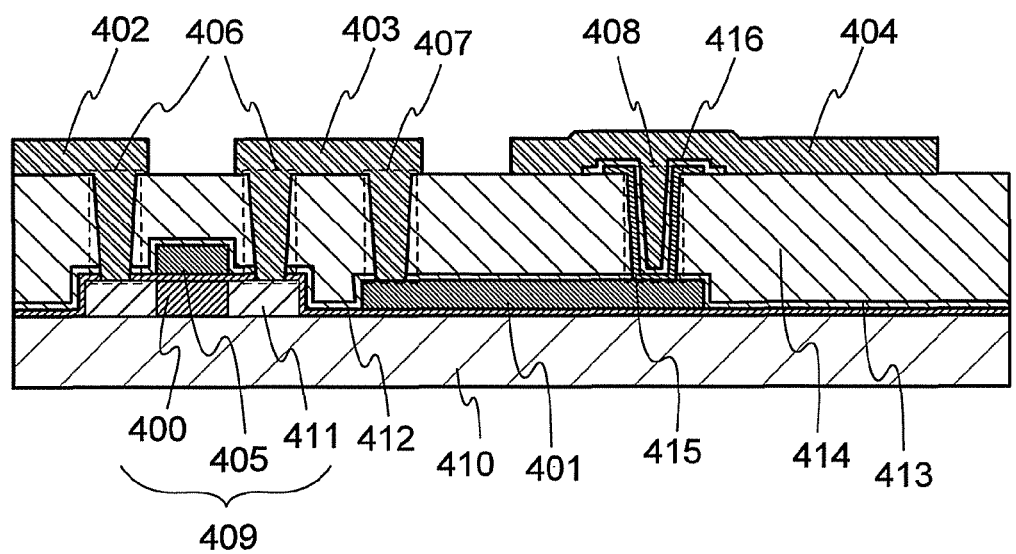
FIG. 9 illustrates a cross-sectional view of a structure of a semiconductor memory device in Embodiment 4.

A structure of an inorganic memory in this embodiment is described with reference to FIG. 8 and FIG. 9. FIG. 8 is top view illustrating a structure of a memory circuit of a semiconductor memory device in this embodiment. FIG. 9 is a cross-sectional view illustrating a structure of a memory circuit of a semiconductor memory device in this embodiment. Note that FIG. 8 and FIG. 9 typically illustrate the semiconductor device for convenience, and all of or part of them is illustrated with use of the dimensions which are different from the actual dimension.

As illustrated in FIG. 8, the memory circuit of the semiconductor memory device in this embodiment includes a semiconductor layer 400, an electrode 401, an electrode 402, an electrode 403, an electrode 404, an electrode 405, an opening 406, an opening 407, and an opening 408.

FIG. 9 illustrates a cross-sectional structure taken along line AB of the memory circuit of the semiconductor memory device in this embodiment. The memory circuit of the semiconductor memory device in this embodiment includes a substrate 410; a semiconductor layer 400 which is formed over the substrate 410 and include an impurity region 411; a gate insulating film 412 provided so as to cover the semiconductor layer 400; an electrode 405 provided over the semiconductor layer 400 with the gate insulating film 412 interposed therebetween; an electrode 401 formed with the same material as the electrode 405; a first interlayer film 413 provided over the electrode 405 and the gate insulating film 412; a second interlayer film 414 provided over the first interlayer film 413; an electrode 402 provided so as to be in contact with the impurity region 411 through the opening 406 provided in the gate insulating film 412, the first interlayer film 413, and the second interlayer film 414; an electrode 403 provided so as to be in contact with the impurity region 411 through the opening 406 provided in the gate insulating film 412, the first interlayer film 413, and the second interlayer film 414 and provided so as to be in contact with the electrode 401 through the opening 407 provided in the gate insulating film 412, the first interlayer film 413, and the second interlayer film 414; an electrode 415 provided so as to be in contact with the electrode 401 through the opening 408 provided in the gate insulating film 412, the first interlayer film 413, and the second interlayer film 414; an inorganic compound layer 416 provided over the electrode 415; and an electrode 404 provided over the inorganic compound layer 416.

Further, the semiconductor memory device in FIG. 9 includes the transistor 409 having the semiconductor layer 400, the gate insulating film 412, the electrode 405, the electrode 402, and the electrode 403.

The impurity region 411 in the transistor 409 is formed by adding an impurity element which imparts p-type conductivity. For example, the impurity region 411 can be formed by adding a p-type impurity element such as boron.

A quartz substrate, a silicon substrate, a metal substrate, a stainless-steel substrate, or the like, in addition to a glass substrate and a flexible substrate, can be used as the substrate 410. A flexible substrate is a substrate which can be bent (flexible). For example, a plastic substrate or the like formed using polycarbonate, polyalylate, polyethersulfone, or the like can be given. Alternatively, an attachment film (formed using polypropylene, polyester, vinyl, polyvinyl fluoride, polyvinyl chloride, or the like), paper formed of a fibrous material, a base material film (polyester, polyamide, an inorganic vapor deposition film, paper, or the like), or the like can be used. Further, the memory element can be provided over a field effect transistor formed on a semiconductor substrate such as a silicon substrate, or over a thin film transistor formed over a substrate such as a glass substrate.

Alternatively, as the substrate 410 any of the following substrates can be used: a single crystal silicon substrate which has n-type or p-type conductivity, a compound semiconductor substrate (e.g., a GaAs substrate, an InP substrate, a GaN substrate, a SiC substrate, a sapphire substrate, a ZnSe substrate, or the like), and an SOI (silicon on insulator) substrate which is manufactured using a bonding method or a SIMOX (separation by implanted oxygen) method. Alternatively, a glass substrate to which single crystal silicon is attached can be used.

As the semiconductor layer 400, a single-layer structure or a stacked-layer structure of amorphous silicon, polycrystalline silicon, microcrystalline (also referred to as microcrystal or semi-amorphous) silicon, or the like can be used. The semiconductor layer 400 can be formed by a sputtering method, an LPCVD method, a plasma CVD method, or the like.

As the gate insulating film 412, one or a plurality of silicon oxide, silicon nitride, silicon oxynitride, and silicon nitride oxide can be used. Note that the film thickness of the gate insulating film 412 in this embodiment can be 10 nm or less.

As the first interlayer film 413 and the second interlayer film 414, an organic material or an inorganic material can be used. For example, one or plurality of silicon oxide, silicon nitride, silicon oxynitride, and silicon nitride oxide, or one or plurality of polyimide, acrylic, a polyamide, polyimide amide, benzocyclobutene, siloxane, and polysilazane can be applied.

The electrode 405 functions as a gate electrode of the transistor 409 and a first word line in the above described Embodiment 2. As the electrode 405, tantalum, tungsten, titanium, molybdenum, aluminum, copper, chromium, niobium, or the like can be used. Alternatively, as well as a film formed of any of the above described metals, the electrode 405 can be formed using a film formed of an alloy which contains any of the above described metals as its main component or a film formed using a compound which includes any of the above described metals. In addition, they can be formed with a single layer or stacked layers. Further alternatively, the electrode 405 can be formed using a semiconductor such as polycrystalline silicon to which an impurity element which imparts conductivity to a semiconductor film such as phosphorus is added. The electrode 405 can be formed by being processed (e.g., patterned) into a predetermined shape.

The electrode 402 and the electrode 403 function as a source electrode or a drain electrode in the transistor 409 and a bit line in the above described Embodiment 2.

The electrode 415, the electrode 404, and the inorganic compound layer 416 function as a memory element in above described Embodiment 1 and Embodiment 2. Specifically, the electrode 415 functions as part of a first terminal in the memory element, and the electrode 404 functions as part of a second terminal in the memory element.

Note that, in this embodiment, the memory circuit can be provided with an auxiliary capacitor. The writing voltage can be compensated by providing the auxiliary capacitor.

An element or a compound with high conductivity can be used as the electrode 401, the electrode 402, the electrode 403, the electrode 404, and the electrode 415. For example, one element selected from gold, silver, platinum, nickel, tungsten, chromium, molybdenum, iron, cobalt, copper, palladium, carbon, aluminum, manganese, titanium, tantalum, an alloy which contains a plurality of the elements can be used. Further, they can be formed with a single layer or stacked layers. As an alloy containing a plurality of the above described elements, for example, an alloyed aluminum including aluminum and titanium, an alloy including titanium and carbon, an alloy including aluminum and nickel, an alloy including aluminum and carbon, an alloy including aluminum, nickel, and carbon, an alloy including aluminum and molybdenum, or the like can be applied. Alternatively, a light transmitting material such as indium tin oxide (ITO), indium tin oxide including silicon oxide (ITSO), or indium zinc oxide (IZO) can be used. Further alternatively, each of the electrode 401, the electrode 402, the electrode 403, the electrode 404, and the electrode 415 can be formed using different materials. The electrode 401, the electrode 402, the electrode 403, the electrode 404, and the electrode 415 can be formed by a vapor deposition method, a sputtering method, a CVD method, a printing method or a droplet discharge method.

As the inorganic compound layer 416, a material including silicon such as an amorphous silicon film, a microcrystalline silicon film, or a polysilicon film, or the like can be used. These silicon films can be formed by a sputtering method, a LPCVD method, a plasma CVD method, or the like.

Alternatively, a silicon film containing oxygen and nitrogen can be used as the inorganic compound layer 416.

The writing principle of the memory element in this embodiment is described below. Note that, in this embodiment, a memory element including the inorganic compound layer which includes silicon as the main element is applied to an inorganic memory element, and writing in the memory element is described.

A predetermined level of voltage is applied between the electrode 415 and the electrode 404, so that silicide formation reaction occurs in the inorganic compound layer 416, and the electrode 415 or the electrode 404. When silicide formation reaction occurs, silicide is formed between the inorganic compound layer 416, and the electrode 415 or the electrode 404. Resistance of the memory element in which silicide is formed decreases. Using the principle by which resistance changes, the respective states before and after the resistance changes are distinguished as the data in the memory element.

As described above, the semiconductor memory device can be easily formed by using an inorganic memory element for a memory element. Further, a thin semiconductor memory device with high reliability can be provided.

Note that this embodiment can be combined with any of the other embodiments as appropriate.

Embodiment 5

In this embodiment, a semiconductor device provided with a semiconductor memory device as an application example of the semiconductor memory device of the present invention is described.

A memory circuit is included in a semiconductor device in this embodiment, and information which is necessary for the memory circuit is stored. Then, information is exchanged with the outside by using contactless means, for example, wireless communication. Using this feature, the semiconductor device in this embodiment has an application such as an individual authentication system by which individual information of articles or the like is stored, and the information is read to identify the articles. In addition, for this application, higher reliability is needed because articles are identified by storing data of the individual information.

Figure 10:
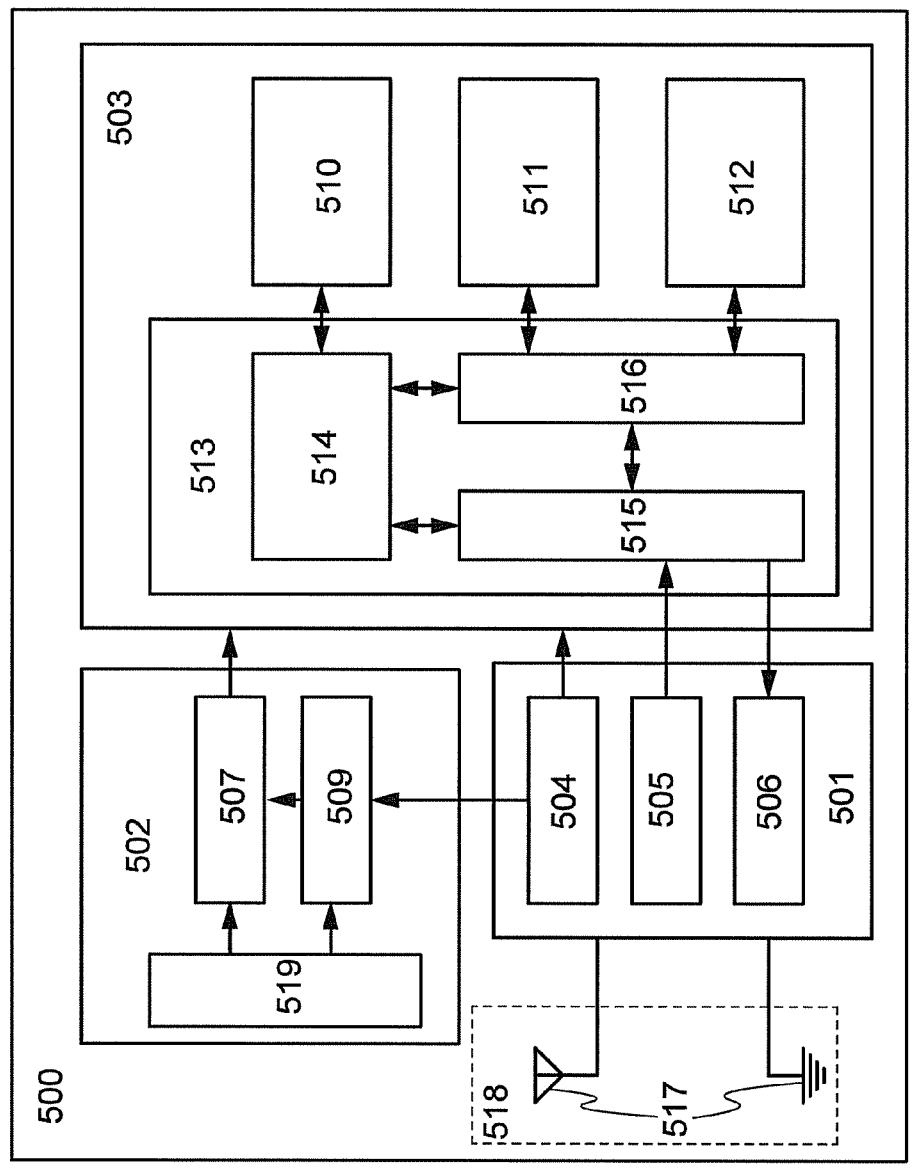
FIG. 10 illustrates a structure of a semiconductor device provided with a semiconductor memory device in Embodiment 5.

The structure of the semiconductor device in this embodiment is described with reference to FIG. 10. FIG. 10 is a block diagram illustrating the structure of the semiconductor device in this embodiment.

As illustrated in FIG. 10, a semiconductor device 500 includes a RF circuit 501, a clock signal generation circuit 502, a logic circuit 503, and an antenna 517 in an antenna portion 518. Note that although it is not illustrated in FIG. 8, the semiconductor device 500 transmits and receives a radio signal to and from an external circuit such as a radio communication device (a device which can communicate wirelessly such as a reader writer or an interrogator) through the antenna 517. Note that data transmission methods are roughly classified into the following three methods: an electromagnetic coupling method, in which a pair of coils is provided so as to be faced with each other and communicates with each other by mutual induction; an electromagnetic induction method, in which communication is performed using an induction field; and an electromagnetic wave method, in which communication is performed using an electromagnetic wave. Any of these methods can be used in this embodiment.

Next, a configuration of each circuit is described. The RF circuit 501 includes a power supply circuit 504, a demodulation circuit 505, and a modulation circuit 506. In addition, the clock signal generation circuit 502 includes a frequency division circuit 507, a counter circuit 509, and a reference clock generation circuit 519. Further, the logic circuit 503 has a function of performing arithmetic processing, and includes a controller 513, a CPU (also referred to as a central processing unit) 510, a ROM (read only memory) 511, and a RAM (random access memory) 512.

Further, the controller 513 includes a CPU interface 514, an RF interface 515, and a memory controller 516.

Further, in the RF circuit 501, the power supply circuit 504 includes a rectifier circuit and a storage capacitor, and has a function of generating power supply voltage from received signals and supplying the power supply voltage to other circuits. The demodulation circuit 505 includes a rectifier circuit and an LPF (low-pass filter) and has a function of extracting a command or data from communication signals. The modulation circuit 506 has a function of modulating transmission data, and modulated data is transmitted as a transmitted signal from the antenna 517.

An operation of a semiconductor device of this embodiment is described below. First, signals transmitted from an external communication device are received by the semiconductor device. The received signals which are input to the semiconductor device are demodulated by the demodulation circuit 505 and then input to the RF interface 515 in the controller 513. The received signals input to the RF interface 515 are arithmetically processed in the CPU 510 through the CPU interface 514. In addition, with the received signals which are input to the RF interface 515, access to the ROM 511 and the RAM 512 is performed through the memory controller 516.

Then, transmission data is generated after arithmetic processing is performed by the CPU 510 and data in the ROM 511 and the RAM 512 is input and output, the transmission data is modulated as a signal by the modulation circuit 506 and is transmitted from the antenna 517 to the external communication device.

In this embodiment, the semiconductor memory device can be mounted as the ROM 511 or the RAM 512 of the semiconductor device, or another memory circuit. When the semiconductor memory device is mounted, a thin semiconductor device with high reliability can be provided. Further, since the semiconductor memory device can be manufactured at low cost, manufacturing cost of the semiconductor device can be reduced.

Note that this embodiment can be combined with any of the other embodiments as appropriate.

Embodiment 6

In this embodiment, a method for manufacturing a semiconductor device provided with a semiconductor memory device is described.

Figure 11A:
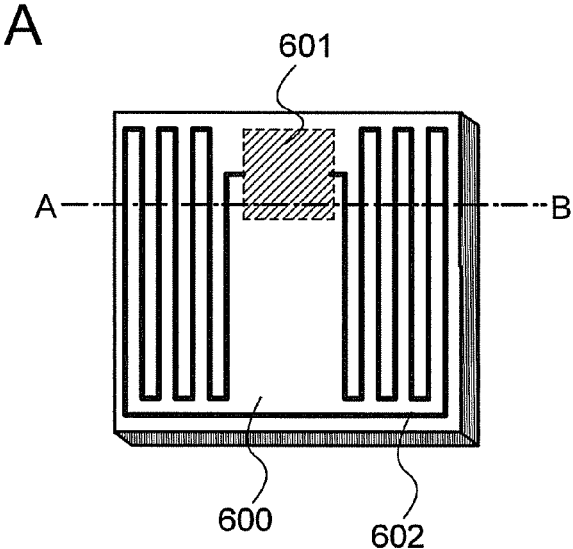
FIGS. 11A and 11B illustrate a structure of a semiconductor device provided with a semiconductor memory device in Embodiment 5.

A semiconductor device of this embodiment is described with reference to FIGS. 11A and 11B. FIG. 11A is a schematic view illustrating the structure of the semiconductor device of this embodiment, and FIG. 11B is a cross-sectional view illustrating the structure of the semiconductor device of this embodiment.

The semiconductor device illustrated in FIG. 11A includes a substrate 600, an element portion 601 which is provided over the substrate 600, and an antenna 602 which is electrically connected to the element portion 601.

The element portion 601 includes a plurality of elements such as semiconductor memory devices and has a function of processing signals received from the outside. The antenna 602 has a function of transmitting data in the semiconductor device.

Figure 11B:
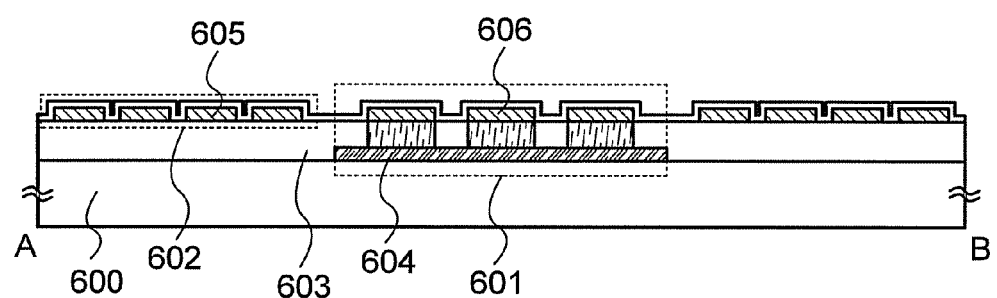

FIG. 11B illustrates a specific structure example of the semiconductor device illustrated in FIG. 11A. A semiconductor device illustrated in FIG. 11B includes an element 604 provided over the substrate 600, an interlayer film 603 provided over the element 604 and the substrate 600, a conductive layer 605 which functions as the antenna 602 provided over the interlayer film 603, and a conductive layer 606 connected to the element 604. Note that a portion which includes the element 604 and the conductive layer 606 is the element portion 601.

Note that although the conductive layer 605 which functions as the antenna 602 is provided in the same layer as the conductive layer 606 in the structure of FIG. 11B, the semiconductor device illustrated in FIG. 11A is not limited to the structure. For example, after the element portion 601 is provided, an insulating film is separately provided so as to cover the element portion and the conductive layer 605 is provided over the insulating film.

Figure 12A:
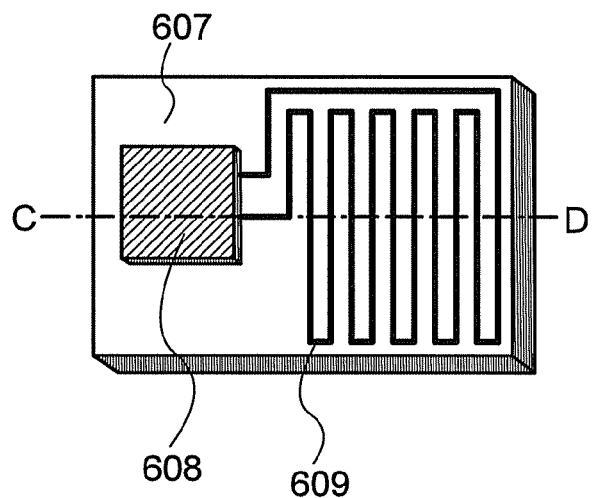
FIGS. 12A and 12B illustrate a structure of a semiconductor device provided with a semiconductor memory device in Embodiment 5.

Furthermore, the semiconductor device of this embodiment is not limited to the structures of FIGS. 11A and 11B. Another structural example of the semiconductor device of this embodiment is described with reference to FIGS. 12A and 12B. FIG. 12A is a schematic view illustrating another structure of the semiconductor device of this embodiment, and FIG. 12B is a cross-sectional view illustrating the structure of the semiconductor device of this embodiment.

The semiconductor device illustrated in FIG. 12A includes a substrate 607, an element portion 608 provided over the substrate 607, and an antenna 609 electrically connected to the element portion 608.

Similar to the structure illustrated in FIGS. 11A and 11B, the element portion 608 includes a plurality of elements such as the memory element and has a function of processing signals received from the outside. The antenna 609 has a function of transmitting data in the semiconductor device.

Figure 12B:
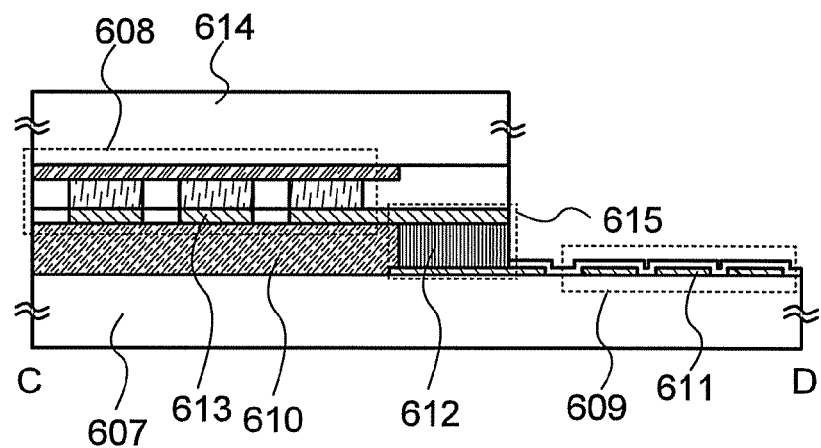

FIG. 12B illustrates a specific structure example of the semiconductor device illustrated in FIG. 12A. The semiconductor device illustrated in FIG. 12B includes the substrate 607, a resin 610 provided over the substrate 607, a conductive layer 611 a part of which functions as the antenna 609, a conductive particle 612 provided over the part of conductive layer 611, a conductive layer 613 provided over the resin 610 and the conductive particle 612, the element portion 608 provided over the conductive layer 613, and a substrate 614 provided over the element portion 608.

In the case of the structure of FIGS. 12A and 12B, a terminal portion 615 is provided, and part of the conductive layer 611 is included in the terminal portion 615. The substrate 614 provided with the element portion 608 is attached to the substrate 607 provided with the antenna 609.

In this embodiment, the semiconductor memory device in Embodiments 1 to 4 can be used as the semiconductor memory device in the element portion 608. When the semiconductor memory devices in Embodiments 1 to 4 are used, a semiconductor device with high reliability can be manufactured at low cost.

When a plurality of element portions 608 are formed over a large substrate in advance and then cut into separate sections, the element portion 608 can be formed at low cost. As the substrate 607 and the substrate 614 used at this time, a glass substrate, a quartz substrate, a ceramic substrate, a metal substrate (e.g., a stainless steel substrate), a semiconductor substrate (e.g., a silicon substrate), or the like can be used. Alternatively, a flexible substrate formed using poly ethyleneterephthalate (PET), polyethylene naphthalate (PEN), polyether sulfone (PES), acrylic, or the like can be used as a plastic substrate.

A plurality of transistors, semiconductor memory devices, and the like which are included in the element portion 608 are not limited to being provided in the same layer, and can be provided in a plurality of layers. When the element portion 608 is provided in a plurality of layers, an interlayer insulating film is used. As a material of the interlayer insulating film, a resin material such as an epoxy resin or an acrylic resin, a light-transmitting resin material such as a polyimide resin, a compound material which includes a siloxane material, such as a siloxane resin, a material which contains a water-soluble homopolymer and a water-soluble copolymer, or an inorganic material can be used. Alternatively, a stacked structure by selecting a plurality of these materials can be employed. The siloxane material corresponds to a material including a Si—O—Si bond. Siloxane has a skeletal structure formed from a bond of silicon (Si) and oxygen (O). As a substituent, an organic group containing at least hydrogen (for example, an alkyl group or aromatic hydrocarbon) is used. Alternatively, a fluoro group may be used as the substituent. Further alternatively, an organic group containing at least hydrogen and a fluoro group may also be used as a substituent. Note that the interlayer insulating film can be formed by a CVD method, a sputtering method, an SOG method, a droplet discharge method, a screen printing method, or the like.

Moreover, as a material of the interlayer insulating film, a material with low dielectric constant is preferably used for reducing parasitic capacitance which is generated between the layers. When the parasitic capacitance is decreased, high-speed operation as well as low power consumption can be achieved.

The conductive layer 611 and the conductive layer 613 can be formed by using a CVD method, a sputtering method, a printing method such as a screen printing method or a gravure printing method, a droplet discharge method, a dispenser method, a plating method, or the like. The conductive layer 611 and the conductive layer 613 can be formed with a single-layer structure or a stacked-layer structure of an element selected from aluminum, titanium, silver, copper, gold, platinum, nickel, palladium, tantalum, or molybdenum, or an alloy material or compound material which contains any of these elements as its main component.

For example, in the case of forming the conductive layer 611 and the conductive layer 613 by using a screen printing method, the conductive layer 611 and the conductive layer 613 can be formed by selectively printing a conductive paste where a conductive particle having a particle size of several nm to several tens μm is dissolved or dispersed in an organic resin. As the conductive particles, metal particles of one or more of silver, gold, copper, nickel, platinum, palladium, tantalum, molybdenum, or titanium; microparticles of a silver halide; or dispersive nanoparticles can be used. As the organic resin included in the conductive paste, one or more selected from organic resins functioning as a binder of metal particles, a solvent, a dispersing agent and a coating material can be used. Typically, an organic resin such as an epoxy resin or a silicone resin can be used. Further, in forming the conductive layer, baking is preferably performed after the conductive paste is pushed out. For example, in the case of using a fine particle which includes silver as its main component (e.g., a particle size is equal to or greater than 1 μm and equal to or less than 100 nm) as a material for the conductive paste, the conductive layer can be obtained by baking it with temperatures in the range of 150 to 300° C. to cure. Alternatively, a fine particle which includes solder or lead-free solder as its main component may be used as a fine particle. In this case, it is preferable that a fine particle having a particle size of 20 μm or less be used. When solder or lead-free solder is used, the conductive layer 611 and the conductive layer 613 can be formed at low cost.

As a transistor used when the integrated circuit or the like is provided over the element portion 608, a transistor which includes an active layer formed using a single-layer structure or a stacked layer structure of any of an amorphous semiconductor, a microcrystalline semiconductor (also referred to as a microcrystal semiconductor), a polycrystalline semiconductor, an organic semiconductor, and the like can be used. In order to obtain a transistor with favorable characteristics, an active layer which is crystallized by using a metal element as a catalyst or an active layer which is crystallized by laser irradiation is preferably used. Alternatively, as an active layer, a semiconductor layer which is formed by a plasma CVD method by using an $SiH_4/F_2$ gas or an $SiH_4/H_2$ gas (an Ar gas), or a semiconductor layer which is irradiated with a laser can be used.

Further, the transistors included in the element portion 608 can be formed using a crystalline semiconductor layer (a low temperature polysilicon layer) which is obtained by crystallizing at a temperature equal to or higher than 200° C. and equal to or lower than 600° C. (preferably equal to or higher than 350° C. and equal to or lower than 500° C.) or a crystalline semiconductor layer (a high temperature polysilicon layer) which is obtained by crystallizing at a temperature equal to or higher than 600° C. When a high temperature polysilicon layer is formed over a substrate, a quartz substrate is preferably used because a glass substrate is weak to heat.

Hydrogen or a halogen element is preferably added to the active layers (particularly channel regions) of the transistors used in the element portion 608 at a concentration equal to or higher than $1 \times 10^{19}$ atoms/cm$^3$ and equal to or lower than $1 \times 10^{22}$ atoms/cm$^3$, more preferably a concentration of equal to or higher than $1 \times 10^{19}$ atoms/cm$^3$ and equal to or lower than $5 \times 10^{20}$ atoms/cm$^3$. Then, an active layer in which a crack is not easily generated with few defects can be obtained.

Further, it is preferable to provide a barrier film which blocks contaminant such as an alkali metal so as to wrap the transistors included in the element portion 608 or the element portion 608 itself. Thus, the element portion 608 which is not contaminated and has improved reliability can be provided. Note that as a barrier film, a silicon nitride film, a silicon nitride oxide film, a silicon oxynitride film, or the like can be used. Further, the thickness of the active layers of the transistors included in the element portion 608 is 20 to 200 nm, preferably 40 to 170 nm, more preferably 45 to 55 nm or 145 to 155 nm, and still more preferably 50 nm or 150 nm. Thus, the element portion 608 in which cracks are not easily generated even in the case of being bent can be provided.

Further, it is preferable that crystals which are included in the active layers of the transistors used in the element portion 608 be formed so as to have a crystal boundary extending in parallel to a direction where carries flow (a channel length direction). Such an active layer is formed using a continuous wave laser, or a pulsed laser which is operated at a frequency equal to or higher than 10 MHz, preferably equal to or higher than 60 MHz and equal to or lower than 100 MHz.

Furthermore, it is preferable that the transistors included in the element portion 608 have characteristics of a subthreshold swing equal to or less than 0.35 V/dec (preferably equal to or greater than 0.09 V/dec and equal to or less than 0.25 V/dec), and a mobility equal to or greater than 10 cm$^2$/Vs. Such characteristics can be realized when the active layers are formed by using a continuous wave laser or a pulsed laser which is operated at a frequency equal to or higher than 10 MHz.

Moreover, the transistors included in the element portion 608 have characteristics equal to or higher than 1 MHz, preferably equal to or higher than 10 MHz (at 3 to 5 V) at the ring oscillator level. Alternatively, each of the transistors included in the element portion 608 has frequency characteristics equal to or higher than 100 kHz, preferably equal to or higher than 1 MHz (at 3 to 5 V) per transistor.

The substrate provided with the element portion can be used directly; however, the semiconductor device in Embodiments 1 to 4 is not limited to this. An example in which a semiconductor device in Embodiments 1 to 4 is manufactured using a different substrate from the substrate provided with an element portion is described with reference to FIGS. 13A to 13C. Plainly speaking, FIGS. 13A to 13C are schematic views illustrating another structure and another method for manufacturing the semiconductor device in this embodiment.

Figure 13A:
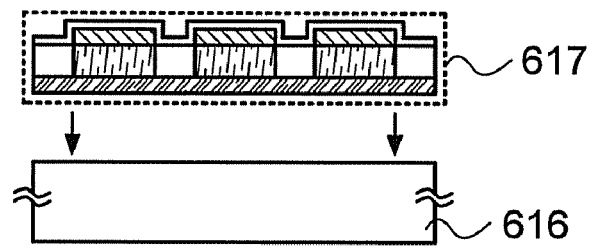
FIGS. 13A to 13C illustrate a structure of a semiconductor device provided with a semiconductor memory device in Embodiment 6.
Figure 13B:
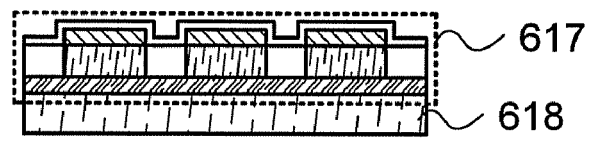
Figure 13C:
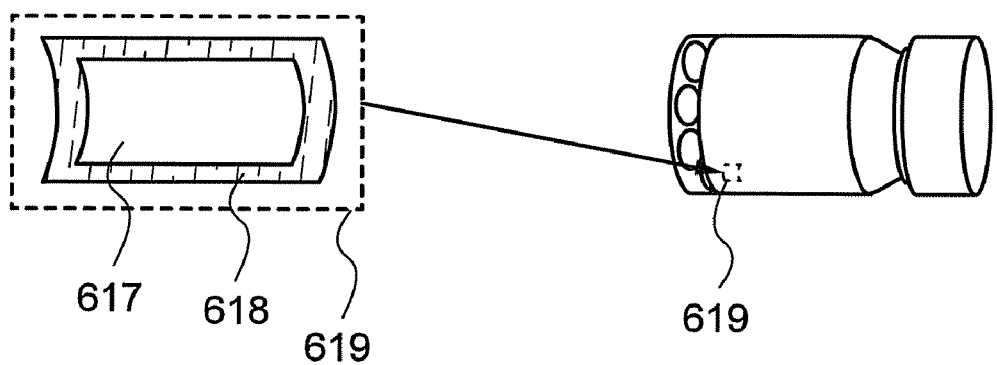

As illustrated in FIG. 13A, in a substrate 616 over which an element portion 617 is formed, the element portion 617 over the substrate 616 is separated. Further, as illustrated in FIG. 13B, the separated element portion 617 can be attached to a substrate 618, which is different from the substrate 616. Note that as the substrate 618, a flexible substrate or the like can be used.

The element portion 617 can be separated from the substrate 616 by any of the following methods: a method in which a metal oxide film is provided between the substrate 616 of high heat resistance and the element portion 617 and the metal oxide film is crystallized to be weakened so that the element portion 617 is separated; a method in which an amorphous silicon film containing hydrogen is provided between the substrate 616 with high heat resistance and the element portion 617 and the amorphous silicon film is removed by laser light irradiation or etching so that the element portion 617 is separated; a method in which the substrate 616 with high heat resistance, over which the element portion 617 is formed, is removed mechanically or by etching with a solution or a gas such as $CF_3$ so that the element portion 617 is separated; and the like.

Alternatively, instead of the above described methods, a metal film (formed using tungsten, molybdenum, titanium, tantalum, or cobalt, for example) which functions as a separation layer, or a metal oxide film (for example, formed using tungsten oxide, molybdenum oxide, titanium oxide, tantalum oxide, cobalt oxide), a stacked-layer structure of a metal film and a metal oxide film, is provided between the substrate 616 and the element portion 617, and the element portion 617 can be separated from the substrate 616 by using physical means. Alternatively, after an opening portion is formed as selected to expose the separation layer, part of the separation layer is removed with an etching agent such as halogen fluoride (e.g., $ClF_3$), and then, the element portion 617 can be separated from the substrate 616 physically.

The separated element portion 617 may be bonded to the substrate 618 by using a commercially available adhesive. For example, an adhesive such as an epoxy resin adhesive or a resin additive may be used.

When the element portion 617 is bonded to the substrate 618 so that the semiconductor device is manufactured as described above, a semiconductor device which is thin, lightweight, and is not easily broken even when it is dropped can be provided. Further, since a flexible substrate is used as the substrate 618, the substrate 618 can be bonded to a curved surface or an irregular shape and various applications are realized. For example, as illustrated in FIG. 13C, a semiconductor device 619 can be tightly attached to a curved surface of a medicine bottle, for example. Moreover, when the substrate 616 is reused, a semiconductor device can be provided at lower cost.

Note that this embodiment can be combined with any of the other embodiments as appropriate.

Embodiment 7

In this embodiment, the case where a flexible semiconductor device is manufactured by using an element which is manufactured by a separation process is described.

Figure 14A:
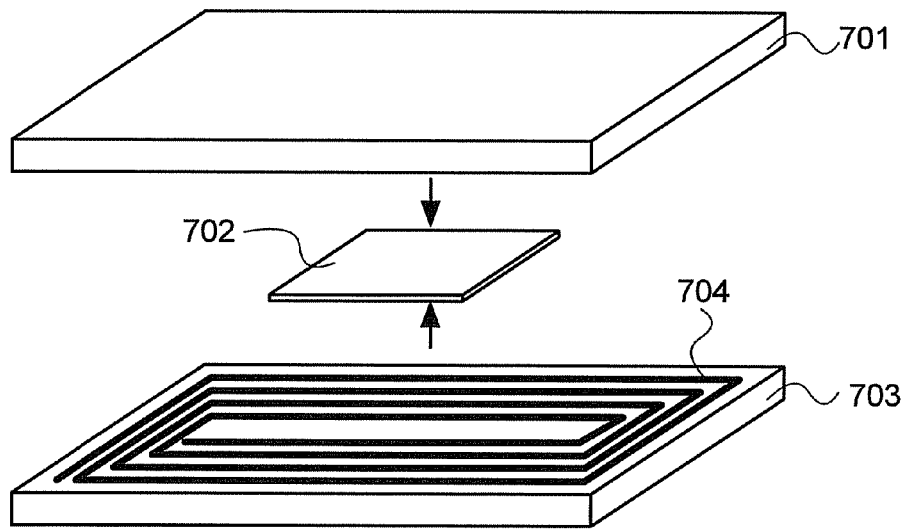
FIGS. 14A to 14C illustrate a structure of a semiconductor device provided with a semiconductor memory device in Embodiment 7.
Figure 14B:
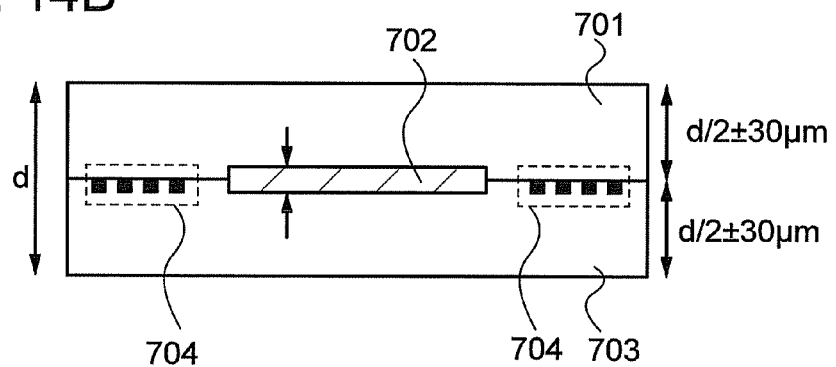
Figure 14C:
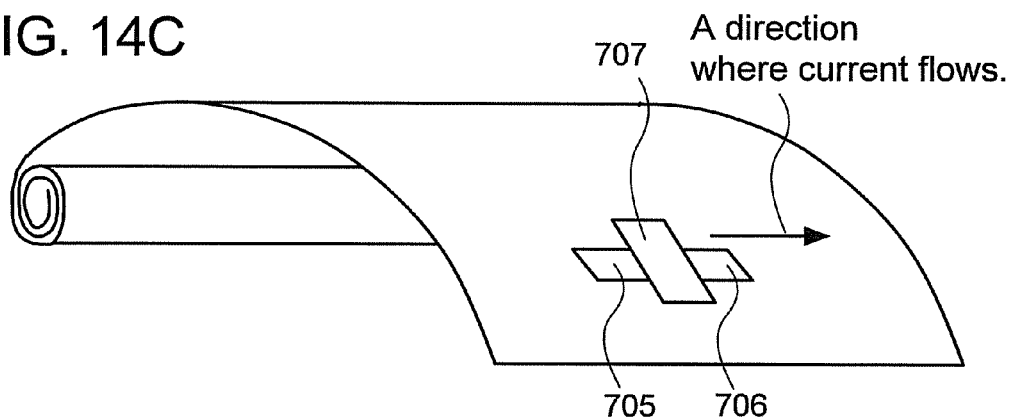

A method for manufacturing a semiconductor device in this embodiment is described with reference to FIGS. 14A to 14C. FIGS. 14A to 14C are top views illustrating the structure of the semiconductor device in this embodiment.

As illustrated in FIG. 14A, the semiconductor device in this embodiment includes a flexible protective layer 701, a flexible protective layer 703 having an antenna 704, and an element portion 702 which is formed through a separation process. The antenna 704 which is formed over the protective layer 703 is electrically connected to the element portion 702. Although the antenna 704 is formed only over the protective layer 703 in FIG. 14A, the structure is not limited to this structure. The antenna 704 can also be provided on the protective layer 701. In addition, when a barrier film formed of a silicon nitride film or the like is formed between the element portion 702, and the protective layers 701 and 703, a semiconductor device having higher reliability can be provided, without contamination of the element portion 702.

As a conductive layer which functions as the antenna 704, any of the materials described in Embodiment 4 can be used. Note that although the element portion 702 and the antenna 704 are connected to each other by UV treatment or ultrasonic cleaning with an anisotropic conductive film, the method is not limited to this method. The element portion 702 and the antenna 704 can be connected to each other by various methods.

As illustrated in FIG. 14B, the thickness of the element portion 702 which is interposed between the protective layers 701 and 703 is preferably equal to or less than 7 μm, more preferably equal to or greater than 0.1 μm and equal to or less than 3 μm. Further, when the protective layer 701 and the protective layer 703 which overlap each other have a thickness of d, each of the protective layer 701 and the protective layer 703 preferably has a thickness of (d/2)±30 μm, and more preferably (d/2)±10 μm. Further, it is preferable that each of the protective layer 701 and the protective layer 703 have a thickness of 10 to 200 μm. Furthermore, the area of the element portion 702 is equal to or less than 5 mm×5 mm (25 mm$^2$), preferably equal to or greater than 0.3 mm×0.3 mm (0.09 mm$^2$) and less than or equal to 4 mm×4 mm (16 mm$^2$).

The protective layer 701 and the protective layer 703 can be formed using an organic resin material. Since the organic resin material has high resistance against bending, it is preferably used as the material of protective layer 701 and protective layer 703. Further, the element portion 702 itself which is formed through the separation process has higher resistance against bending than a single crystal semiconductor. Since the element portion 702, and the protective layer 701 and the protective layer 703 can be tightly attached to each other without any space, a completed semiconductor device itself also has high resistance against bending. The element portion 702 surrounded by the protective layer 701 and the protective layer 703 may be provided over a surface of or inside another object, or embedded in paper.

The case where the element portion which is formed through the separation process is attached to a substrate having a curved surface is described below.

As illustrated in FIG. 14C, one transistor which is selected from the element portion formed through the separation process is linear in a direction where current flows. Namely, a drain electrode 705, a gate electrode 707, and a source electrode 706 are located linearly. Then, the current flow direction and the direction in which the substrate draws an arc are arranged to be perpendicular to each other. With such arrangement, even when the substrate is bent to draw an arc, the influence of stress is small, and variation in characteristics of transistors included in the element portion can be suppressed.

Further, when the ratio of the area of an active region (a silicon island portion) of an active element such as a transistor to the whole area of the substrate is 1 to 50% (preferably 1 to 30%), damage of the element due to stress can be prevented.

In a region where an active element is not provided, a base insulating film material, an interlayer insulating film material, and a wiring material are mainly provided. The ratio of the area of other than the active region such as a transistor to the whole area of the substrate is preferably equal to or higher than 60%. Thus, a semiconductor device which can be easily bent and has a high integration degree can be provided.

When a semiconductor device which has a semiconductor memory device is manufactured using the method for manufacturing the semiconductor device in this embodiment as described above, the semiconductor device can be manufactured even over a curved surface, and the application range of the semiconductor device can be made wider.

Note that this embodiment can be combined with any of other embodiments as appropriate.

Embodiment 8

In this embodiment, an application example of the semiconductor device provided with a semiconductor memory device in Embodiment 7 is described.

Usage examples of a semiconductor device which has any of the semiconductor memory devices of the aforementioned embodiments are described with reference to FIGS. 15A to 15F. FIGS. 15A to 15F are schematic views illustrating usage examples of a semiconductor device of the present invention.

Figure 15A:
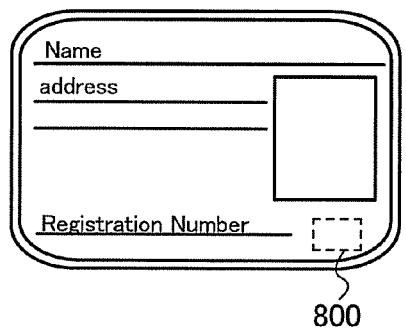
FIGS. 15A to 15F illustrate application examples of a semiconductor device provided with a semiconductor memory device in Embodiment 8.
Figure 15B:
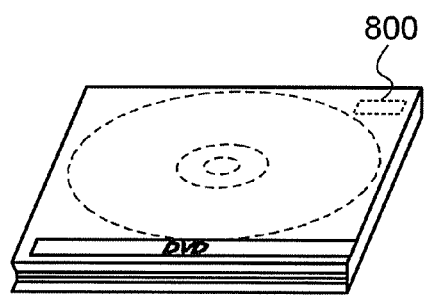
Figure 15C:
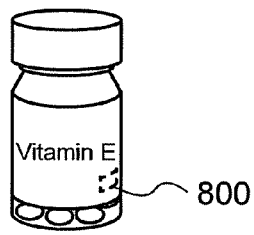
Figure 15D:
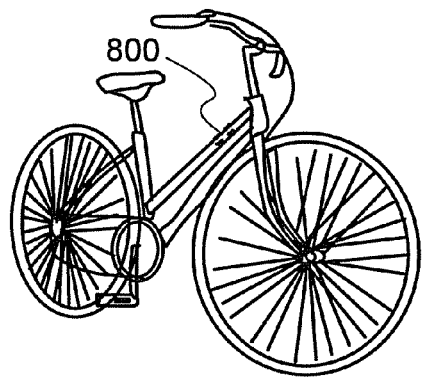
Figure 15E:
Figure 15F:
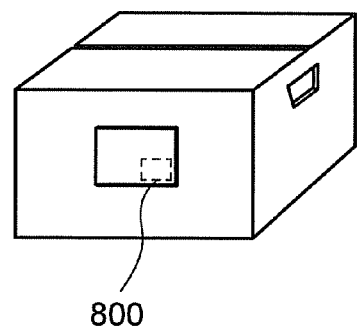

As illustrated in FIGS. 15A to 15F, the semiconductor device can be used widely and can be used by being provided for, for example, bills, coins, securities, bearer bonds, certificates (e.g., driver's licenses or resident cards, see FIG. 15A), or objects such as containers for wrapping (e.g., wrapping paper or bottles, see FIG. 15C), recording media (e.g., DVDs or video tapes, see FIG. 15B), vehicles (e.g., bicycles, see FIG. 15D), personal belongings (e.g., bags or glasses), foods, plants, animals, human bodies, clothes, living wares, or electronic devices (e.g., liquid crystal display devices, EL display devices, television sets, or mobile phones), or shipping tags of the articles (see FIGS. 15E and 15F).

A semiconductor device 800 in this embodiment is mounted on a printed substrate, attached to a surface, or incorporated to be fixed in an article. For example, the semiconductor device is incorporated in paper of a book or in an organic resin of a package to be fixed in each article. Since the semiconductor device 800 of this embodiment can be compact, thin, and lightweight, the design quality of the articles itself is not degraded even after the device is fixed to the articles. Further, by providing bills, coins, securities, bearer bonds, documents, and the like with the semiconductor device 800 of this embodiment, they can be provided with an identification function, and forgery can be prevented by making use of the identification function. Further, by the semiconductor device 800 of the this embodiment being provided in containers for wrapping objects, recording media, personal belongings, foods, clothes, commodities, electronic devices, or the like, a system such as an inspection system can be performed efficiently. Even vehicles can have higher security against theft or the like by being provided with the semiconductor devices 800 of this embodiment.

When a semiconductor device provided with the semiconductor memory device of the present invention is used for each usage described in this embodiment in this manner, data which is used for exchanging information can be maintained at an accurate value. Therefore, authenticity or security of the articles can be increased.

Note that this embodiment can be combined with any of the other embodiments as appropriate.

This application is based on Japanese Patent Application serial No. 2008-096833 filed with Japan Patent Office on Apr. 3, 2008, the entire contents of which are hereby incorporated by reference.

What is claimed is:

1. A semiconductor device comprising:
a first control circuit;
a second control circuit;
a transistor, the transistor being a p-type transistor, a gate of the transistor being electrically connected to the first control circuit through a first word line, and one of a source and a drain of the transistor being electrically connected to the second control circuit through a bit line, and
a memory element, a first terminal of the memory element being electrically connected to the other of the source and the drain of the transistor, and a second terminal of the memory element being electrically connected to the first control circuit through a second word line,
wherein:
the first control circuit is configured to supply a first potential to the gate of the transistor through the first word line,
the second control circuit is configured to supply a second potential to the one of the source and the drain of the transistor through the bit line,
the first control circuit is configured to supply a third potential to the second terminal of the memory element through the second word line,
the third potential at a time of data writing is negative potential, and
a potential difference between the second potential and the third potential at the time of data writing is larger than a withstand voltage of the transistor.

2. The semiconductor device according to claim 1, wherein a potential difference between the first potential and the second potential at the time of data writing is larger than an absolute value of a threshold voltage of the transistor.

3. The semiconductor device according to claim 1, wherein the potential difference between the second potential and the third potential at the time of data writing is larger than 10V.

4. The semiconductor device according to claim 1, wherein a thickness of a gate insulating film of the transistor is 10 nm or less.

5. The semiconductor device according to claim 1, wherein the memory element includes one of an organic compound layer and an inorganic compound layer disposed between the first terminal and the second terminal.

6. The semiconductor device according to claim 1, further comprising:
an antenna,
an RF circuit configured to generate a power supply voltage using a signal supplied from the antenna, and
a logic circuit configured to perform arithmetic processing.

7. A semiconductor device comprising:
a first control circuit;
a second control circuit;
a transistor, the transistor being a p-type, a gate of the transistor being electrically connected to the first control circuit through a first word line, and one of a source and a drain of the transistor being electrically connected to the second control circuit through a bit line, and
a memory element, a first terminal of the memory element being electrically connected to the other of the source and the drain of the transistor, and a second terminal of the memory element being electrically connected to the first control circuit through a second word line,
wherein:
the first control circuit is configured to supply a first potential to the gate of the transistor through the first word line,
the second control circuit is configured to supply a second potential to the one of the source and the drain of the transistor through the bit line, the first control circuit is configured to supply a third potential to the second terminal of the memory element through the second word line,
the third potential at a time of data writing is negative potential,
a potential difference between the second potential and the third potential at the time of data writing is larger than a withstand voltage of the transistor, and
a potential difference between the first potential and the second potential at the time of data writing is equal to or smaller than the withstand voltage of the transistor.

8. The semiconductor device according to claim 7, wherein the potential difference between the first potential and the second potential at the time of data writing is larger than an absolute value of a threshold voltage of the transistor.

9. The semiconductor device according to claim 7, wherein the potential difference between the second potential and the third potential at the time of data writing is larger than 10V.

10. The semiconductor device according to claim 7, wherein a thickness of a gate insulating film of the transistor is 10 nm or less.

11. The semiconductor device according to claim 7, wherein the memory element includes one of an organic compound layer and an inorganic compound layer disposed between the first terminal and the second terminal.

12. The semiconductor device according to claim 7, further comprising:
an antenna,
an RF circuit configured to generate a power supply voltage using a signal supplied from the antenna, and
a logic circuit configured to perform arithmetic processing.

13. A semiconductor device comprising:
a first control circuit;
a second control circuit;
a transistor, the transistor being a p-type, a gate of the transistor being electrically connected to the first control circuit through a first word line, and one of a source and a drain of the transistor being electrically connected to the second control circuit through a bit line, and
a memory element, a first terminal of the memory element being electrically connected to the other of the source and the drain of the transistor, and a second terminal of the memory element being electrically connected to the first control circuit through a second word line,
wherein:
the first control circuit is configured to supply a first potential to the gate of the transistor through the first word line,
the second control circuit is configured to supply a second potential to the one of the source and the drain of the transistor through the bit line,
the first control circuit is configured to supply a third potential to the second terminal of the memory element through the second word line,
the third potential at a time of data writing is negative potential,
a potential difference between the second potential and the third potential at the time of data writing is larger than a withstand voltage of the transistor,
a potential difference between the first potential and the second potential at the time of data writing is equal to or smaller than the withstand voltage of the transistor, and
a potential difference between the first terminal of the memory element and the second terminal of the memory element at the time of data writing is higher than the withstand voltage of the transistor.

14. The semiconductor device according to claim 13, wherein the potential difference between the first potential and the second potential at the time of data writing is larger than an absolute value of a threshold voltage of the transistor.

15. The semiconductor device according to claim 13, wherein the potential difference between the second potential and the third potential at the time of data writing is larger than 10V.

16. The semiconductor device according to claim 13, wherein a thickness of a gate insulating film of the transistor is 10 nm or less.

17. The semiconductor device according to claim 13, wherein the memory element includes one of an organic compound layer and an inorganic compound layer disposed between the first terminal and the second terminal.

18. The semiconductor device according to claim 13, further comprising:
an antenna,
an RF circuit configured to generate a power supply voltage using a signal supplied from the antenna, and
a logic circuit configured to perform arithmetic processing.

19. A semiconductor device comprising:
a transistor, the transistor being a p-type transistor, and
a memory element, a first terminal of the memory element being electrically connected to one of a source and a drain of the transistor,
wherein:
the semiconductor device is configured to supply a first potential to a gate of the transistor, a second potential to the other of the source and the drain of the transistor, and a third potential to a second terminal of the memory element, the third potential being a negative potential; and
a potential difference between the second potential and the third potential at a time of data writing is larger than a withstand voltage of the transistor.

20. The semiconductor device according to claim 19, further comprising
an antenna,
an RF circuit configured to generate a power supply voltage using a signal supplied from the antenna, and
a logic circuit configured to perform arithmetic processing.

* * * * *